United States Patent [19]

Tamura et al.

[11] Patent Number: 5,005,028
[45] Date of Patent: Apr. 2, 1991

[54] IMAGE FORMING METHOD AND TRANSFER RECORDING MEDIUM THEREFOR

[75] Inventors: Yasuyuki Tamura, Yokohama; Shuzo Kaneko, Tokyo, both of Japan

[73] Assignee: Canon Kabushiki Kaisha, Tokyo, Japan

[21] Appl. No.: 242,022

[22] Filed: Sep. 8, 1988

Related U.S. Application Data

[62] Division of Ser. No. 869,689, Jun. 2, 1986.

[30] Foreign Application Priority Data

| Jun. 3, 1985 | [JP] | Japan | 60-120080 |
| Jun. 3, 1985 | [JP] | Japan | 60-120081 |
| Jun. 17, 1985 | [JP] | Japan | 60-131411 |
| Jun. 20, 1985 | [JP] | Japan | 60-134831 |
| Jul. 9, 1985 | [JP] | Japan | 60-150597 |
| Sep. 10, 1985 | [JP] | Japan | 60-199926 |
| Nov. 11, 1985 | [JP] | Japan | 60-250884 |

[51] Int. Cl.⁵ .................................... G01D 15/10
[52] U.S. Cl. ........................ 346/76 R; 346/76 PH; 400/120
[58] Field of Search .................. 346/76 PH, 76 R; 400/120

[56] References Cited

U.S. PATENT DOCUMENTS

| 3,116,148 | 12/1963 | Miller | 96/48 |
| 3,219,446 | 11/1965 | Berman | 96/28 |
| 3,249,494 | 7/1966 | Schlein et al. | 96/27 |
| 3,944,361 | 3/1976 | Tnoue et al. | 355/27 |
| 3,982,940 | 9/1976 | Kinjo et al. | 430/199 |
| 4,149,887 | 4/1979 | Levy | 96/67 |
| 4,387,153 | 6/1983 | Bonneron | 430/199 X |
| 4,395,718 | 7/1983 | Murayama et al. | 346/135.1 |
| 4,440,846 | 4/1984 | Sanders et al. | 430/138 |
| 4,500,624 | 2/1985 | Aono et al. | 430/203 |
| 4,501,809 | 2/1985 | Hiraishi et al. | 430/138 |
| 4,536,463 | 8/1985 | Sanders | 430/138 |
| 4,542,084 | 9/1985 | Watanabe et al. | 430/46 |
| 4,602,263 | 7/1986 | Borror et al. | 346/201 |
| 4,624,910 | 11/1986 | Takeda | 430/203 |
| 4,629,675 | 12/1986 | Takehara et al. | 430/203 |
| 4,629,676 | 12/1986 | Hayakawa et al. | 430/292 X |
| 4,632,899 | 12/1986 | Takeda | 430/292 |

FOREIGN PATENT DOCUMENTS

| 0109838 | 5/1984 | European Pat. Off. |
| 0111297 | 6/1984 | European Pat. Off. |
| 1077977 | 12/1957 | Fed. Rep. of Germany |
| 2248545 | 10/1972 | Fed. Rep. of Germany |
| 3226608 | 2/1983 | Fed. Rep. of Germany |
| 2083120 | 12/1971 | France |
| 2516268 | 5/1983 | France |
| 484278 | 9/1936 | United Kingdom |
| 860590 | 5/1957 | United Kingdom |
| 974837 | 3/1961 | United Kingdom |
| 2113860 | 8/1983 | United Kingdom |
| 2160671 | 12/1985 | United Kingdom |

OTHER PUBLICATIONS

Patent Abstracts of Japan, vol. 4 (5):45E-165 (1980).
Patent Abstracts of Japan, vol. 3, (131):82E-148 (1979).

(List continued on next page.)

Primary Examiner—Mark J. Reinhart
Assistant Examiner—Huan Tran
Attorney, Agent, or Firm—Fitzpatrick, Cella, Harper & Scinto

[57] ABSTRACT

A transfer recording medium comprising a transfer recording layer is provided. The transfer recording layer causes an irreversible change in transfer characteristic when provided with plural kinds of energies such as heat, light and pressure energies. Such plural energies are applied to the transfer recording layer with at least one energy applied imagewise to provided a transferable portion or latent image portion in the transfer recording layer. The transferable portion is then transferred to a medium such as plain paper. The provision of plural kinds of energies aids in realization of high quality multi-color transfer image in a compact apparatus through functional separation of image formation and transfer operations. Further, even a multi-color image can be obtained through a single transfer step.

19 Claims, 15 Drawing Sheets

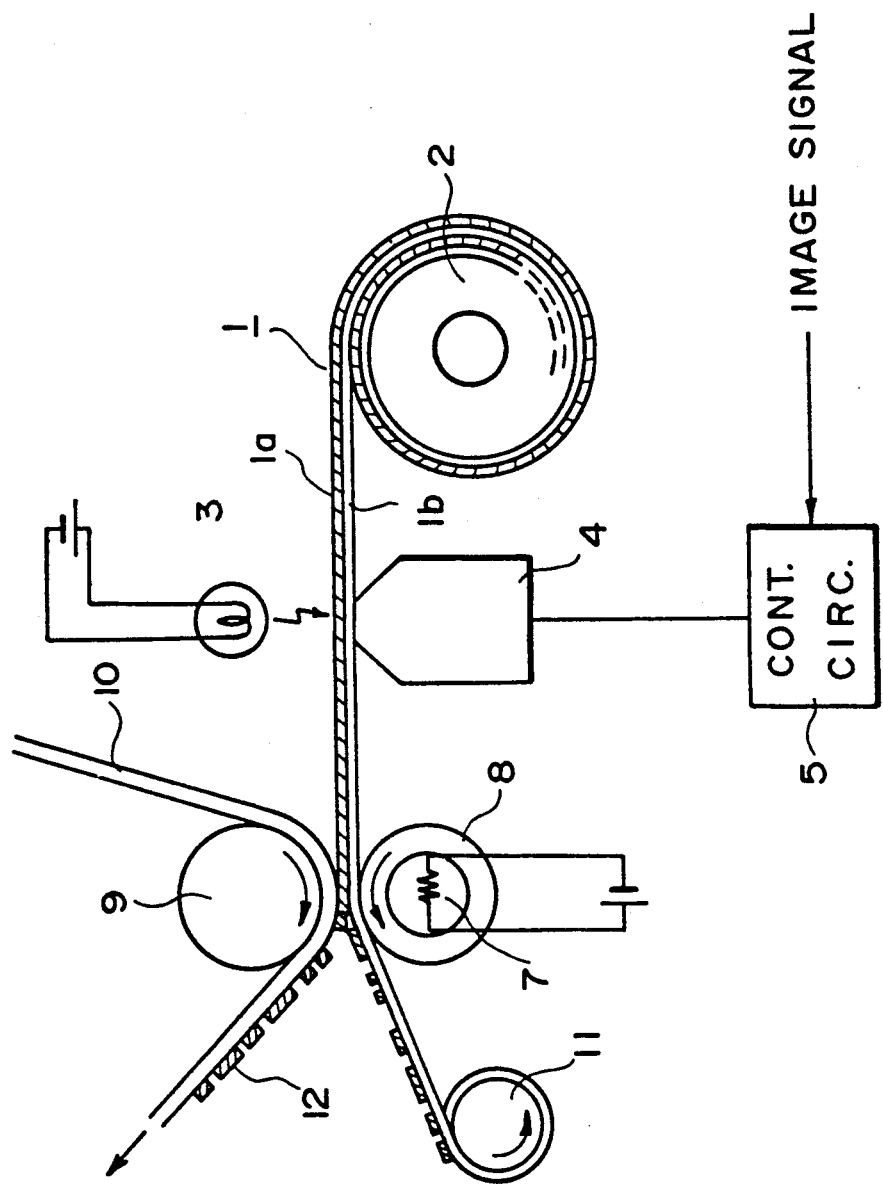

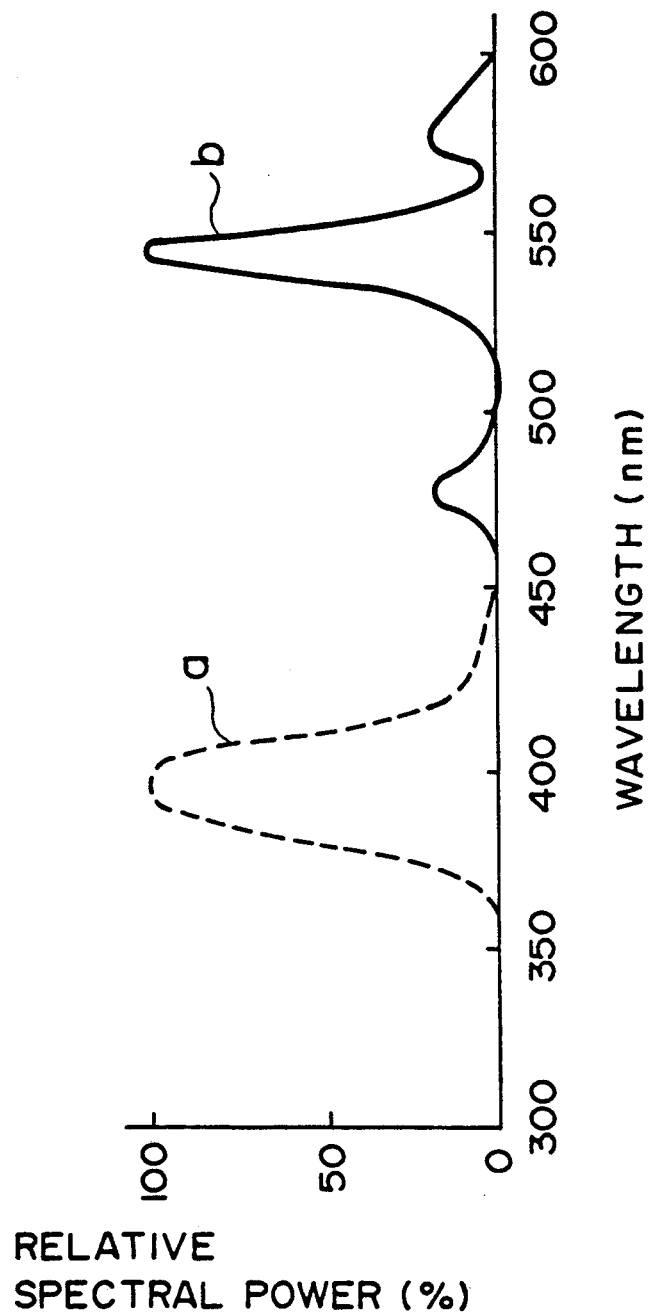
F I G. 10

FIG. II

IMAGE FORMING METHOD AND TRANSFER RECORDING MEDIUM THEREFOR

This is a division of application Ser. No. 869,689, filed June 2, 1986.

FIELD OF THE INVENTION AND RELATED ART

The present invention relates to an image forming method, a transfer recording medium and an image forming apparatus applicable for printers, copying machines, and facsimile machines.

In recent years, accompanying the rapid progress of the information industry, various information processing systems have been developed, and various recording methods and apparatus have been developed corresponding to respective information processing systems. As a recording method among such recording methods, the heat-sensitive or thermal transfer recording method has advantages since the apparatus employed is light in weight, compact, free of noise, excellent in operability and adapted to easy maintenance. Accordingly it has been recently widely used. According to this method, plain paper can be used as a medium to be transfer-printed or as a recording medium.

However, the heat-sensitive transfer recording method of the prior art is not free from drawbacks. That is, according to the heat-sensitive transfer recording method of the prior art, the transfer recording performance, namely the printed letter quality, is remarkably influenced by the surface smoothness of the recording medium, and therefore while good printing can be effected on a recording medium having high smoothness, the printed letter quality will be markedly lowered in the case of a paper with low smoothness. However even paper which is the most typical recording medium present problems paper with high smoothness is rather unusual. Ordinary paper exhibits surface uneveness to various extents because they are formed through entanglements of fibers As a result, according to the conventional heat-sensitive transfer recording method, the resulting printed image may not be sharp at the edge portion or a part of the image may be missing which lowers the printed letter plurality.

Further, in the conventional heat-sensitive transfer recording method, while the transfer of an ink layer to the medium to be transfer printed is caused by only the heat supplied from a thermal head, it is difficult even from a theoretical point of view to increase the heat supply from the thermal head. That is a problem because it is required to cool the thermal head to a prescribed temperature in a limited short time and it is also necessary to prevent occurrence of thermal crosstalk between heat-generation segments or elements constituting the thermal head face. For this reason, high speed recording has been difficult to realize according to the conventional heat-sensitive transfer recording method.

Further, as heat conduction has a slow response speed compared with electricity or light, it has been generally difficult to control a heat sufficient to be capable of reproduce a medium tone by the conventional recording system using a transfer medium, and also it has been impossible to effect a medium tone recording as the conventional heat-sensitive transfer ink layer lacks a transfer function for gradational representation.

Further, in the conventional heat-sensitive transfer recording method, it has been only possible to obtain one image through one transfer operation, and accordingly, it has been necessary to repeat several times the transfer step to superpose colors in order to obtain a multi-color image. Since it is very difficult to exactly superpose images of different colors it has been difficult to obtain an image free of color deviation or aberration. Particularly, when one picture element is involved superposition of colors has not been effected in such a one picture element, and consequently, a multi-color image has been constituted by assembly or gathering of picture elements involving color deviation in the conventional heat-sensitive transfer recording method. For this reason, it has been impossible to obtain a clear multi-color image according to the conventional heat-sensitive transfer recording method.

Further, when it is devised to obtain a multi-color image by the conventional heat-sensitive transfer recording method, there have been attendant difficulties, of plural thermal heads or complex movement reproduce of direction involving and stopping of media to be printed which require a large and complex apparatus or a decrease in recording speed.

This has been proposed a transfer imaging method for producing a multicolor image by using a color precursor chromagenic material and a developer (U.S. Pat. No. 4,399,209). More specifically, in this method, an imaging sheet comprising a substrate and a coating thereon comprising a chromagenic material and a radiation curable composition encapsulated in rupturable capsules, is provided; the coating is subjected to imagewise exposure with actinic radiation to cure the radiation curable composition and form a latent image and the latent image is superposed onto a developer sheet to form a visible image or the developer sheet. In such a known method, only light energy is used for forming a latent image on a transfer recording method (image sheet), so that a recording medium highly sensitive to light or a light flux of a high energy is required in order to obtain a clear image at a high speed. A high sensitivity recording medium generally has poor storage stability and is therefore inappropriate for easy handling. Further, it is difficult to obtain the high energy required for curing a radiation-curable composition at a high speed with a single kind of energy, particularly a light energy. Accordingly, a large apparatus has been generally required.

SUMMARY OF THE INVENTION

It is therefore a principal object of the present invention to provide an image forming method which has solved the above mentioned problems accompanying the conventional heat-sensitive transfer recording method.

A specific object of the present invention is to provide an image forming method by which a high-quality transfer image can be formed on plain paper which has a low surface smoothness and is a most popular recording medium or medium to be transfer-printed.

A further object of the present invention is to provide an image forming method which affords a high speed recording and a medium tone recording.

A still further object of the present invention is to provide an image forming method which affords a clear multi-color transfer image without requiring a complicated movement of a medium to be transfer printed.

Another object of the present invention is to provide a transfer recording medium and an image forming apparatus adapted for use in the above mentioned image forming method.

According to a principal aspect of the present invention, there is provided an image forming method, comprising providing a transfer recording medium comprising a transfer recording layer, said transfer recording layer being capable of causing an irreversible change in transfer characteristic thereof when provide with plural kinds of energies; imparting the plural kinds of energies to the transfer recording layer under such a condition that at least one of the plural kinds of energies is imparted imagewise, i.e., corresponds to a recording information signal, thereby to form a transferable portion in the transfer recording layer; and transferring the transferable portion of the transfer recording layer to a transfer-receiving medium or medium to be transfer-printed, thereby to leave an image corresponding to the transferable portion on the transfer-receiving medium or medium to be transfer-printed.

The term "irreversible change in transfer characteristic" used herein means that the change in transfer characteristic caused by provision of the plural kinds of energies lasts even after the removal of the energies and is retained semi-permanently or at least until the subsequent transfer step. The term "transferable portion" or "latent image (portion)" used herein means a portion of the transfer recording layer provided by local change in the transfer characteristic. The transferable portion or latent image (portion) is generally not clearly visible but can be visible.

These and other objects, features and advantages of the present invention will become more apparent upon a consideration of the following description of the preferred embodiments of the present invention taken in conjunction with the accompanying drawings, wherein like parts are denoted by like reference numerals.

"Parts" or "%" used hereinafter with reference to a composition are by weight unless otherwise noted specifically.

BRIEF DESCRIPTION OF THE DRAWINGS

FIGS. 3-8, 12 and 14 are respectively a schematic side view showing an example of a system arrangement for practicing the image forming method according to the present invention;

FIGS. 10 and 13 respectively show spectral characteristic curves of light fluxes for illuminating a transfer recording medium in an example of the image forming method.

DETAILED DESCRIPTION OF THE INVENTION

In the image forming method according to the present invention, a latent image to be transferred may be formed by changing a physical property controlling a transfer characteristic. The physical property controlling a transfer characteristic may be determined depending on a particular type of transfer recording medium used. For example, with respect to a transfer recording medium used in a transfer mode wherein transfer of an image is effected through heat fusion of the image, the physical property may be a melting temperature, a softening temperature, a glass transition temperature, etc. With respect to a transfer recording medium used in a transfer mode wherein transfer of image is effected by making an image to be transferred viscous or penetrable into a medium to be transfer printed, the physical property may be a viscosity at the relevant temperature Further, plural kinds of energy used for providing transfer images may also be determined depending on the type of transfer recording medium used, inclusive of light, electron beam, heat, pressure, etc., which may be appropriately combined.

Figure 1A:
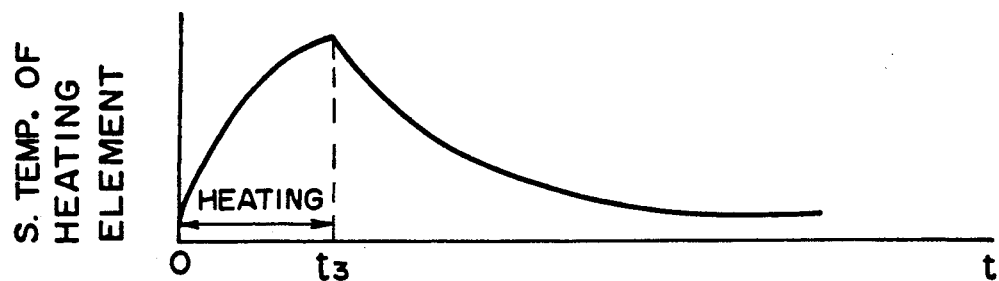
FIGS. 1A-1D show changes of several parameters with elapse of time involved in a latent image forming step according to the present invention.
Figure 1B:
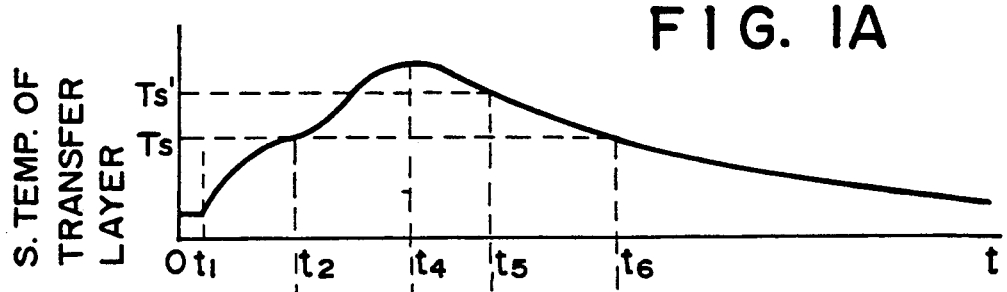

For comprehension of the image forming method according to the present invention, an example of using a transfer recording medium for which a latent image is formed by light and heat energies is explained with reference to FIGS. 1A to 1D, wherein the abscissas are indicated on a common scale of time. The transfer recording layer contains a reaction initiator, a polymerizing component, etc., which will be explained hereinafter. FIG. 1A shows a surface temperature change of a heating element when a heating means such as a thermal head is energized for heat generation for a period of 0 - $t_3$ and subjected to temperature decrease thereafter A transfer recording medium contacting the heating means under pressure causes a temperature change as shown in FIG. 1B corresponding to the temperature change of the heating means. More specifically, it starts to cause a temperature rise after a time delay of $t_1$ and similarly reaches the maximum temperature at time $t_4$ after time $t_3$, then followed by temperature decrease The transfer recording layer has a softening temperature Ts and abruptly softens to decrease its viscosity in a temperature region above Ts. The change in viscosity is shown by a curve A in FIG. 1C. Thus, after the temperature reaches Ts at time $t_2$ and until it reaches the maximum temperature at time $t_4$, the viscosity continually decreases, while the viscosity again increases thereafter along with temperature decrease to show an abrupt increase in viscosity until time $t_6$ when the temperature decreases to Ts. In this case, the transfer recording layer has not been basically subjected to any material change and shows a decrease in viscosity in the manner as described above when it is heated above Ts in a subsequent transfer step.

Accordingly, if the transfer recording layer is caused to contact a medium to be transfer printed under pressure and subjected to heating required for transfer, e.g., to a temperature above Ts, the transfer. recording layer is transferred in the same transfer mechanism as involved in the conventional heat-sensitive transfer recording. In this invention, however, when the transfer recording layer is illuminated or exposed to light from $t_2$ in parallel with heating as shown in FIG. 1D, and the temperature is sufficiently increased, the transfer recording layer softens and the reaction initiator, is actuated to provide a large reaction velocity and the polymerizing component rapidly causes curing or hardening, sometimes involving crosslinking.

Figure 1C:
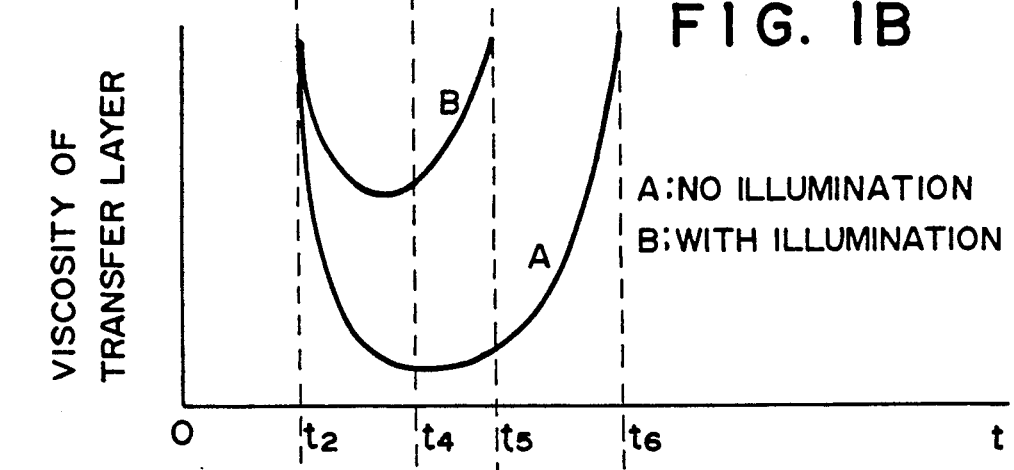
Figure 1D:
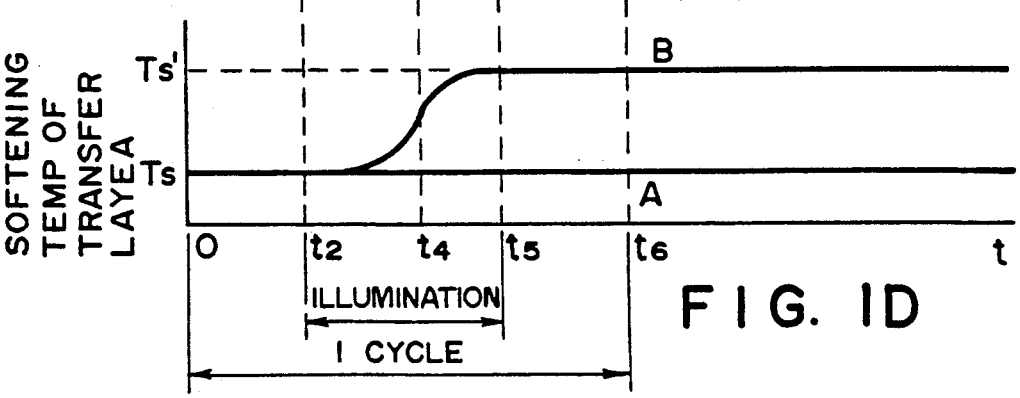

In this way, if heating and illumination are simultaneously carried out, the transfer recording layer shows a viscosity change as represented by a curve B in FIG. 1C. Then, along with further progress of curing, the softening temperature is raised from Ts to Ts' at time $t_2$ when the curing is completed. Corresponding to this, the transfer recording layer is caused to have a different transfer initiation temperature, i.e., a temperature at which it starts to be transferred, from Ta to Ta'. The change in softening temperature as described above of the transfer recording layer is illustrated in FIG. 1D. As a result, the transfer recording layer has a portion having a transfer initiation temperature Ta' and also a portion retaining a transfer initiation temperature Ta which behave differently in a subsequent transfer step. Now, when the transfer recording layer is heated to a temperature Tr satisfying Ta<Tr<Ta', the portion having a transfer initiation temperature Ta preferentially causes an abrupt decrease in viscosity to be selectively transferred to a medium to be transfer-printed. In this instance, Ta' - Ta (or Ts' - Ts) should preferably be about 20° C. or more while it somewhat depends on temperature stabilization accuracy during the transfer step. In this way, a latent image may be formed by controlling heating or non-heating in combination with simultaneous illumination, corresponding to an image signal.

As will be understood from the above description, the degree of irreversible change in transfer characteristic required for the transfer recording layer in the present invention is conveniently represented by a change in transfer initiation temperature. Herein, the transfer initiation temperature mentioned herein is a value measured by the following method.

A 6 $\mu$-thick transfer recording layer formed on a 6 $\mu$-thick polyethylene terephthalate (PET) film is caused to contact 0.2 mm-thick wood-free paper as a medium to be transfer-printed having a surface smoothness (Bekk smoothness) of 50-200 seconds The resultant laminate of the transfer recording medium and the paper is passed at a rate of 2.5 mm/sec be ween a pair of rolls as follows. The first roller is a hollow cylindrical iron roller of 40 mm diameter in which a 300 W-halogen lamp heater is stored and is disposed on the side of the transfer recording medium. The second roller disposed on the side of the paper comprises a similar iron roller of 40 mm diameter coated with a 0.5 mm-thick fluorine rubber layer. The two rollers are operated to exert a linear pressure of 4 kg/cm. In the measurement, the surface temperature of the first roller is measured by a temperature sensor, e.g., a thermistor, while controlling the halogen lamp heater to provide a prescribed temperature. At a time of 4 seconds after the laminate is passed through the two rollers, the transfer recording method is peeled off the paper moved horizontally at a peeling angle of about 90° and at a rate equal to the conveying speed of the rollers, so that it is observed whether the transfer recording layer has been transferred onto the paper. The operation is continued while gradually raising the surface temperature of the first roller (at a rate of 10° C./min or less), and the minimum temperature at which the transfer starts to occur effectively (as identified by saturation of a transferred image density) is identified as the transfer initiation temperature of the transfer recording medium or the transfer recording layer. The measurement of the transfer initiation temperature is conducted in the same manner both before and after an imaging operation or provision of plural kinds of energies.

The irreversible change in transfer characteristic may alternatively be represented by a change in softening temperature of the transfer recording layer. The softening temperature of the transfer recording layer may conveniently be determined by the thermal mechanical analysis (TMA) which is in principle a method wherein a softening temperature of a sample is determined by subjecting the sample to a constant weight exerted by a needle and gradually heating the sample to observe how the needle penetrates into the sample. Herein, the softening temperature is based or a value measured in the following manner. Thus a 20 $\mu$-thick transfer recording layer is formed on a 1 mm-thick Al-substrate and subjected to a pressure of 70 g/cm$^2$ exerted by 500 mg-weight through a straight needle having a tip area of 0.7 mm$^2$. The temperature is raised at a rate of 10° C./min and the penetration behavior of the needle is observed. The softening temperature is given by a temperature at which the penetration speed abruptly increases.

The degree of change in transfer initiation temperature or softening temperature of a transfer recording layer before and after the provision of plural kinds of energies is preferably 20° C. or more, particularly 40° C. or more.

The irreversible change in transfer characteristic of a transfer recording layer may also be represented by change in another physical property such as a melting temperature, a glass transition temperature, etc., instead of the transfer initiation temperature or softening temperature as described above. In any case, a latent image may be formed in a transfer recording layer by utilizing an irreversible change in melting temperature, glass transition temperature, etc. As the melting temperature and glass transition temperature change with a similar tendency as a softening temperature, the change in melting temperature or glass transition temperature may be similarly utilized in the manner as described above with respect to the softening temperature.

Based on the above explanation for reference, an embodiment of multi-color image forming method will be explained.

FIGS. 2A-2D are schematic partial sectional views showing a relationship between a transfer recording medium and a thermal head according to the present invention. In this embodiment, a heat energy modulated according to a recording signal is applied in combination with a light energy selected depending on the color of an image forming element of which the physical property controlling a transfer characteristic is intended to be changed. Herein, "modulation" is an operation of changing a position to which the energy is applied corresponding to a given image signal, and "in combination" covers a case where the light energy and the heat energy are applied simultaneously as well as a case where the light energy and the heat energy are applied separately.

A multi-color transfer recording medium 1 according to this embodiment comprises a transfer recording layer 1a disposed on a base film 1b. The transfer recording layer 1a is formed as a layer of distributed minute image forming elements 31. Respective image forming elements show different color tones. In the embodiment shown in FIGS. 2A-2D, for example, each image forming element 31 contains any one colorant selected from cyan (C), magenta (M), yellow (Y) and black (K). The colorants to be contained in the image forming elements 31, however, are not restricted to cyan, magenta, yellow and black, but may be colorants of any color depending on an intended use. Each image forming element 31 contains in addition to a colorant, a functional or sensitive component, of which the physical property controlling a transfer characteristic abruptly changes when light and heat energies are applied thereto. The image forming elements 31 may be formed on the substrate 1b together with a binder or by heat-melting the above components.

The functional component in the image forming elements 31 has a wavelength dependency depending on the colorant contained. More specifically, an image forming element 31 containing a yellow colorant causes abrupt crosslinking to be cured when a heat flux and a light beam with a wavelength (Y) are applied thereto. Similarly, an image forming element 31 containing a magenta colorant, an image forming element 31 containing a cyan colorant and an image forming element 31 containing a black colorant respectively cause abrupt crosslinking to be cured when a heat and a light beam with a wavelength $\lambda(M)$, heat and a light beam with a wavelength $\lambda$ (C), and heat and a light beam with a wavelength $\lambda$ (K), respectively, are applied thereto. A cured or hardened image forming element 31 does not cause decrease in viscosity even when heated in a subsequent transfer step, so that it is not transferred to a medium to be transfer-printed. The heat and light are applied corresponding to an information signal to be recorded.

In this embodiment of the image forming method according to the present invention, the transfer recording method 1 is superposed on a thermal head 20, and light is illuminated so as to cover the entire heat generation region of the thermal head 20. The wavelengths of the illumination light are so selected sequentially as to react on image forming elements to be illuminated. For example, if image forming elements 31 to be illuminated are colored in any one of cyan, magenta, yellow and black, light beams having a wavelength $\lambda(C)$, $\lambda(M)$, $\lambda(Y)$ and $\lambda(K)$, respectively, are successively irradiated.

Figure 2A:
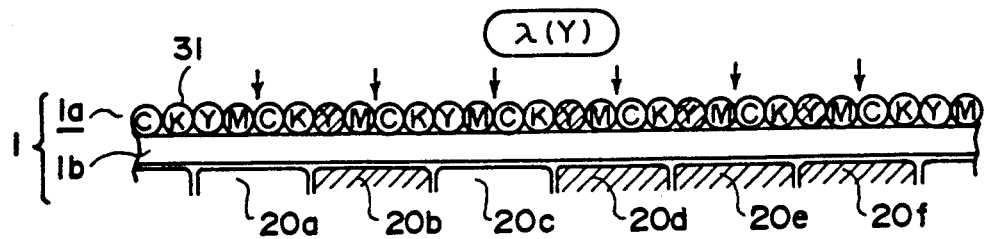
FIG. 2A-2D are schematic partial sectional views showing a relationship between a transfer recording medium and a thermal head involved in a multi-color transfer recording mode according to the present invention.
Figure 2B:
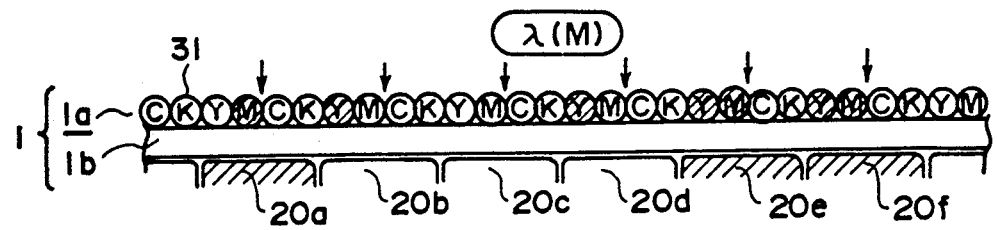

More specifically, while the transfer recording method is illuminated with a light beam having a wavelength $\lambda(Y)$, resistance heating elements 20b, 20d, 20e and 20f, for example, of the thermal head are caused to generate heat As a result, among the image forming elements 31 containing a yellow colorant, those applied with the heat and the light beam with a wavelength $\lambda(Y)$ are cured as shown by hatching in FIG. 2A (In FIGS. 2B, et seq., the cured elements are also indicated by hatching).

Figure 2C:
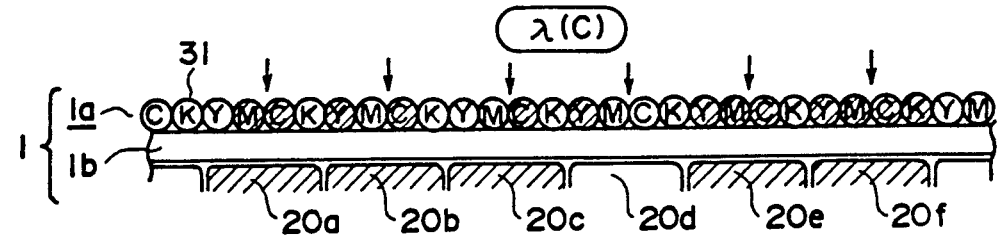
Figure 2D:
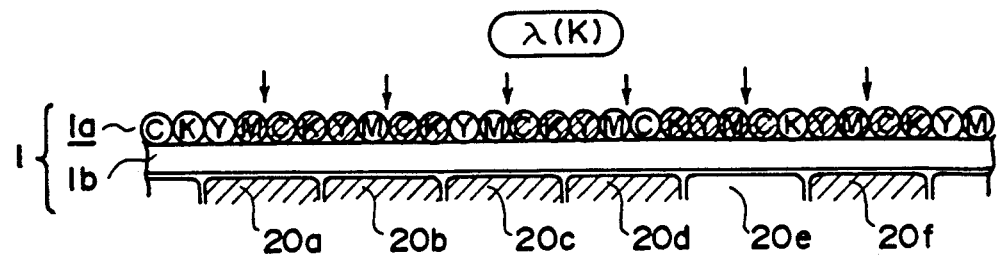
Figure 2E:
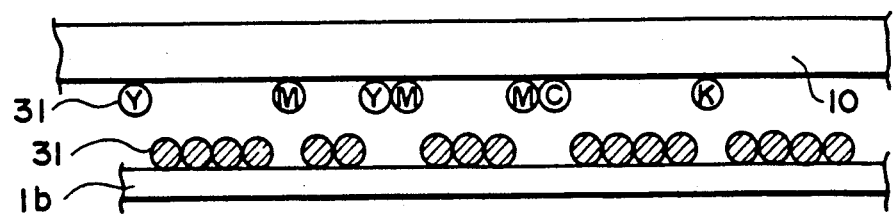

Then, as shown in FIG. 2B, while the transfer recording layer 1a is illuminated with a light beam with a wavelength $\lambda(M)$, resistance heating elements 20a, 20e and 20f are caused to generate heat, whereby among the image forming elements containing a magenta colorant, those applied with the heat and the light beam with a wavelength $\lambda(M)$ are cured. Further, as shown in FIGS. 2C and 2D, while the light fluxes with wavelengths $\lambda(C)$ and $\lambda(D)$ are provided, prescribed resistance heating elements are caused to generate heat, whereby image forming elements applied with the heat and light are cured to finally leave a latent image formed of non-cured image forming elements 31. The latent image is then transferred to a medium to be transfer-printed 10 in a subsequent transfer step as shown in FIG. 2E.

In the transfer step, the transfer recording medium on which the latent image has been formed is caused to contact the medium to be transfer-printed 10 through the faces and heat is applied from the transfer recording medium side or the medium 10 side, whereby the latent image is selectively transferred to the medium to be transfer-printed 10 to form a visible image thereon. Accordingly, the heating temperature in the transfer step is so determined in connection with the change in transfer characteristics that the latent image is selectively transferred. Further, in order to effectively carry out the transfer, it is also effective to apply a pressure simultaneously. The pressurization is particularly effective when a medium to be transfer-printed having a low surface smoothness is used. Further, where the physical property controlling a transfer characteristic is a viscosity at room temperature, the pressurization alone is sufficient to effect the transfer.

The heating in the transfer step is suitable for producing a durable multi-color image with a stability and an excellent storability.

In the above embodiment explained with reference to FIGS. 2A to 2D, the entire area of the thermal head 20 is illuminated with light while resistance heating elements of the thermal head 20 are selectively energized. On the contrary, while a certain area of the transfer recording medium are uniformly heated, e.g., by energizing all the resistance heating elements of the thermal head 20 shown in FIG. 20, light illumination may be effected selectively or imagewise to form a similar multi-color image. More specifically, light energy having a wavelength modulated according to a recording signal and selected depending on the color of an image forming element of which the physical property controlling a transfer characteristic is intended to be changed, is imparted along with heat energy.

Referring to FIG. 2A, the thermal head 20 is entirely and uniformly energized instead of selectively energizing resistance heating elements 20b, 20d, 20e and 20f, while the transfer recording layer 1a at the portions corresponding to the resistance heating elements 20b, 20d, 20e and 20f is illuminated with a light beam having a wavelength $\lambda(Y)$. Also, when a light beam having $\lambda(M)$ is used, the entirety of the thermal head 20 is energized and the parts corresponding to the resistance heating elements 20a, 20e and 20f are illuminated. The illumination with light beams having wavelengths $\lambda(C)$ and $\lambda(K)$ is similarly conducted.

In the above explanation, the means for entirely and uniformly heating the transfer recording layer 1a has been explained to be a thermal head but may be another uniform heating means such as a heating roller or a hot plate.

Further, in the above explanation, the image forming elements transferred to the medium to be transfer-printed (e.g., a recording paper) are depicted as discrete points for convenience of explanation in FIG. 2E, but may actually be spread two-dimensionally on the medium to be transfer-printed, so that they form respective picture elements in order, e.g., corresponding to respective heating elements of the thermal head in the embodiment shown in FIGS. 2A–2E.

In the above, there has been explained an embodiment wherein respective image forming elements have a sensitivity to a particular spectral region. This is not an essential requirement. If materials having sensitivities to different temperatures are used in respective image forming elements, they can be differentiated by applying different heat energies even if they do not have different spectral sensitivities. More specifically, if image forming elements having temperature dependencies are used, it is possible to uniformly irradiate the image forming elements with light and apply heat energies as information signals varying with colors of respective image forming elements.

In the above embodiment with reference to FIGS. 2A to 2E, a multi-color image is obtained by using a transfer recording method according to the present invention. However, a monocolor image may also be produced by using a similar transfer recording method if a single colorant is used in all the image forming elements. In this case, it is not necessary to have the functional components correspond to respective colorants.

In the embodiment shown in FIGS. 2A–2E, the transfer recording layer 1a is formed as a coating layer of particulate image forming elements, but may also be a uniformly melted continuous coating layer. Further, the particulate image forming elements may also be in the form of capsules each comprising a core and a wall encapsulating the core In case of capsular image forming elements, the colorant and the functional component are generally contained in the core. In order to obtain a multi-color image, particulate or capsular particulate image forming elements may preferably be used. Such image forming elements may preferably be distributed at a rate of 25% to the closest packing state in terms of the projection area to the substrate. In a case where the transfer recording layer is formed of capsular image forming elements, the walls of the image forming elements are ruptured in the transfer step to mainly transfer the core material onto a medium to be transferred to form a image thereon. Accordingly, the heating temperature in the transfer step is so determined in connection with the change in transfer characteristic that the latent image is selectively transferred.

The transfer recording medium used in the present invention may be any one having a transfer recording layer capable of causing an irreversible change in transfer characteristic when provided with plural kinds of energies Such an irreversible change in transfer characteristic may be caused through changes in physical properties such as melting temperature, softening temperature, glass transition temperature, and viscosity.

The image forming elements constituting, a transfer recording layer contains a functional component and a colorant The functional component may preferably be a substance which can initiate a reaction leading to the physical property change or can abruptly change the velocity of such a reaction when provided or irradiated with plural energies such as light and heat. The functional component may be defined as a component principally responsible for the above mentioned irreversible change in transfer characteristic of the transfer recording layer and may include a polymerizable component or depolymerizing component, and an optionally used initiator and sensitizer, as will be described hereinafter.

A typical example of such a functional component may be a polymerizing component such as a monomer, oligomer or polymer.

Specific examples of the oligomer or polymer include those compounds having a reactive group at a terminal or in a side chain such as polyvinyl cinnamate, p-methoxycinnamic acid-succinic acid half ester copolymer, polyvinylstyrylpyridinium, polymethyl vinyl ketone, polyethylene glycol acrylate, polyethylene glycol acrylate, polyethylene glycol dimethacrylate, polypropylene glycol diacrylate; or epoxy resins, unsaturated polyester resins, polyurethane resins, polyvinyl alcohol resins, polyamide resins, polyacrylic acid type resins, polymaleic acid type resins. Further specific examples include acrylic acid esters, acrylic acid amides, methacrylic acid esters, and methacrylic acid amides.

Examples of the polymerizable monomer include ethylene glycol diacrylate, propylene glycol diacrylate, ethylene glycol dimethacrylate, 1,4-butanediol diacrylate, N,N'-methylenebisacrylamide, methyl acrylate, methyl methacrylate, cyclohexyl acrylate, benzyl acrylate, acrylamide, methacrylamide, N-methylolacrylamide, N-diacetonacrylamide, styrene, acrylonitrile, vinyl acetal, ethylene glycol diacrylate, butylene glycol dimethacrylate, 1,4-bitanediol diacrylate, 1,6-hexanediol dimethacrylate, diethylene glycol diacrylate, and triethylene glycol diacrylate.

In order to initiate or promote the reaction of the polymerizing component, a reaction initiator may be added as desired. The reaction initiator may preferably be a radical generator such as azo compounds, organic sulfur compounds, carbonyl compounds, and halogen compounds. Specific examples of the reaction initiator used for this purpose include; carbonyl compounds such as benzophenone, benzyl, benzoin ethyl ether, and 4-N,N-dimethylamino-4'-methoxybenzophenone; organic sulfur compounds such as dibutyl sulfide, benzyl disulfide, and decyl phenyl sulfide; peroxides such as di-tert-butyl peroxide, and benzoyl peroxide; halogen compounds such as carbon tetrachloride silver bromide, and 2-naphthalenesulfonyl chloride; nitrogen compounds such as azobisisobutyronitrile, and benzenediazonium chloride.

Further, in order to produce a transfer recording layer particularly adapted to use for formation of a latent image under the combination of light and heat energies, the reaction initiator and the polymerizing component may be selected from the respective groups so as to provide a combination having a large temperature dependency of reaction velocity with respect to the reaction between a reaction initiator which is caused to have an activity when provided with light energy and a polymerizing component.

A preferred example of such a combination may be obtained by using a heat-fusible urethane acrylate-type polymerizable monomer as the polymerizing component and using 2-chloro-thioxanthone or ethyl-p-dimethylaminobenzoate as the reaction initiator. In order to control the transferability, an acrylic resin may be additionally used as a binder.

The coloring component or colorant is a component to provide an optically recognizable image and may be appropriately selected from various pigments and dyes. Specific examples of the colorant include: inorganic pigments such as carbon black, lead yellow, molybdenum red, and red iron oxide; organic pigments such as Hansa Yellow, Benzidine Yellow, Brilliant Carmine 6B, Lake Red C, Permanent Red F5R, Phthalocyanine Blue, Victoria Blue Lake, and Fast Sky Blue; leuco dyes, and phthalocyanine dyes.

In addition, the transfer recording layer may also contain a stabilizer such as hydroquinone, p-methoxyphenol, p-tert-butylcatechol, and 2,2'-methylene-bis(4-ethyl-6-tert-butylphenol).

In order to enhance the activation of the reaction initiator, the transfer recording layer may further contain a sensitizer such as p-nitroaniline, 1,2-benzanthraquinone, p,p'-dimethylaminobenzophenol, anthraquinone, 2,6-dinitroaniline, and Michler's ketone.

The transfer recording layer of the transfer recording medium according to the present invention may further contain a binder component such as a resin, wax or a mesomorphic compound.

The binder component may be resins such as homopolymers or copolymers of polyester type, polyamide-type, polyurethane-type, polyurea-type, polyvinyl-type, silicone-type, polyacetylene-type, and polyether-type; waxes including vegetable waxes such as candelilla wax, and carnauba wax, animal waxes such as beeswax, and whale wax, mineral waxes such as ceresine wax, and montan wax, petroleum wax such as paraffin wax; and synthetic waxes including polyethylene wax, sasol wax, montan wax derivatives, paraffin wax derivatives, hardened castor oil, hardened castor oil derivative, fatty acids such as stearic acid, fatty acid amides, fatty acid esters; or mesomorphic compounds such cholesterol hexanoate, cholesterol decanoate, cholesterol methylcarbonate, 4'-methoxybenzylidene-4-acetoxyaniline, 4'-methoxybenzylidene-4-methylaniline, 4'-ethoxybenzylidene-4-cyanoaniline, N,N'-bisbenzylidene-3,3'-dimethoxybenzidine.

When the image forming elements constituting the transfer recording layer are provided in the form of microcapsules, the core of the capsules may be formed of the above mentioned materials for the transfer recording layer. On the other hand, the wall of the microcapsules may for example be formed of a material including gelatine, gum arabic, cellulosic resins such as ethyl cellulose, and nitrocellulose, polymers such as urea-formaldehyde resin, polyamides, polyesters, polyurethane, polycarbonate, maleic anhydride copolymers, polyvinylidene chloride, polyvinyl chloride, polyethylene, polystyrene, and polyethylene terephthalate.

In order to constitute the transfer recording medium according to the present invention into one adapted for use in multi-color image formation, the image forming elements containing different colorants may preferably have sensitivities to different wavelengths. As described hereinbefore, when the transfer recording layer is composed of a number (n) of colors of image forming elements, the image forming elements should preferably contain n types of functional components allotted to respective colors and each providing an abruptly changing reaction velocity when irradiated with a particular wavelength of light. These functional components in combination of n kinds are respectively contained in the image forming elements which are distributed to form a transfer recording layer. Examples of such a combination include, as a combination for a two-color recording system, one comprising:

a sensitizer sensitive to about 400–500 nm, such as:

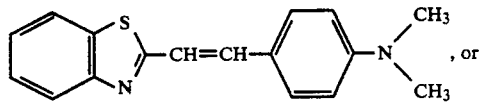

, or

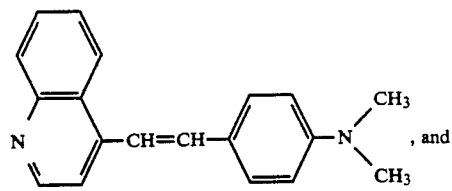

, and a sensitizer sensitive to about 480–600 nm such as

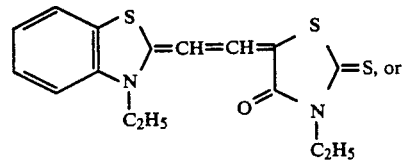

, or

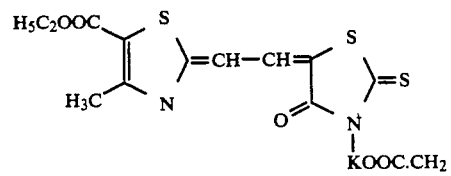

In this case, the sensitivity regions of the above two types of sensitizers overlap each other in the region of 480–500 nm, but this is a low sensitivity region to both types of sensitizers. Thus, they can be almost completely separated from each other, if necessary, by using appropriate light sources.

Sensitivity separation adapted for three color image forming element system may be provided by using an azo compound having a sensitivity to 340–400 nm or a halogen compound having a sensitivity to 300–400 nm in combination with the above sensitizers, so that a full-color recording system may be developed.

Further, as a combination of reaction initiators, one of ⓐ 2-chlorothioxanthone/ethyl p-dimethylaminobenzoate, and ⓑ dichlorobenzophenone/ethyl p-dimethylaminobenzoate, may also be used. Light sources of ⓐ a fluorescent light having a peak wavelength of 390 nm and a fluorescent light having a peak wavelength of 313 nm may be used in combination with the above combination of the reaction initiators. In order to provide the same degree of reaction (i.e., the same transfer density level), the required illumination energy level is assumed to be 1 (standard) for a combination ⓐ-ⓐ, 4 (times) for ⓐ-ⓑ, 1.1 for ⓑ-ⓑ, and 5 for ⓑ-ⓐ. As a result, if the light source ⓐ is used at the illumination energy level of 1 and the light source ⓑ is used at the illumination energy level of 1.1, the reaction initiator systems ⓐ and ⓑ can be separately activated so as to provide substantially the same reaction degree.

Further, even in a case where the functional components contained in the image forming elements have substantially the same spectral sensitivity or wavelength dependency, the respective image forming elements can have different spectral sensitivities due to different filter effects of colorants contained therein. For example, a blue colorant transmits and reflects wavelengths of about 400–500 nm for blue light and absorbs the region of 500–700 nm for green to red light. Accordingly, an image forming element containing a blue colorant has a sensitivity to blue light. For the same reason, an image forming element containing a red colorant has a sensitivity to red light. Thus, even if image forming elements contain a functional component sensitive to a blue-red spectral range, they can have separate sensitivities because of the colorants contained therein.

In the transfer recording medium used in the present invention, it is possible that the radical reactivity of the transfer recording layer is suppressed because of oxygen in the air. In order to obviate this difficulty, it is preferred to provide an oxygenshielding layer by applying an aqueous polyvinyl alcohol solution containing a small amount of a surfactant on the transfer recording layer. The oxygen-shielding layer may be removed after the latent image formation by washing with water. In case of image forming elements in the form of microcapsules, it is possible to have the walls show a function of the oxygen-shielding layer.

The color transfer recording medium used in the present invention may for example be produced in the following manner The various components forming the transfer recording layer such as the functional component, reaction initiator, sensitizer, stabilizer, colorant, etc., may be melt-mixed and coated on a substrate such as a polyimide film by means of an application, etc., to form a transfer recording medium. In case where the transfer recording layer is formed of image forming elements of multi-colors, for example, the above components may be mixed and formed into minute image forming elements by spray drying, etc., for respective colors, and the resultant image forming elements of respective colors are sufficiently mixed with a binder such as a polyester resin in a solvent such as methyl ethyl ketone and ethylene glycol diacetate and coated by a solvent-coating method onto a substrate such as a polyimide film, followed by drying. e.g., at 80° C. for 3 minutes to remove the solvent to form a transfer recording layer in a thickness of 1-20 microns, preferably 3-10 microns. Thus, a desired transfer recording medium may be obtained.

In a case where the image forming elements are in the form of microcapsules, they are produced in a manner, e.g., as described in Examples appearing hereinafter and may be coated on a substrate by a coating method as described above with reference to the minute image forming elements, and using a solution of a binder such as polyvinyl alcohol and an epoxy adhesive as a dispersion medium thereby to form a transfer recording layer in a thickness of 1-20 microns, preferably 3-10 microns. The image forming elements, preferably in the form of microcapsules, are generally formed into an average particle size of 1-20 microns, preferably 3-10 microns, with a wall thickness in the range of 0.1-2 microns, preferably 0.1-0.5 micron. Substantially all the image forming elements should preferably have particle sizes in the range of ±50%, particularly ±20% from the average particle size. The binder for use in microcapsule coating is, e.g., in such as amount that it provides a thickness of 0.1-1 micron.

In the above described examples, a portion of the transfer recording layer provided with plural kinds of energies is caused to have an elevated melting temperature. However, if a transfer recording medium having a transfer recording layer which contains a functional component or a depolymerizing component caused to have a lower softening or melting point, a portion of the transfer recording layer provided with plural kinds of energy directly forms a latent image to be transferred.

Examples of this type of functional components include: polymethyl vinyl ketone, polyvinyl phenyl ketone, copolymers of methyl vinyl ketone or methyl isopropenyl ketone with ethylene, styrene, etc., copolymer of vinyl chloride, acrylates, etc., with carbon monoxide, polyamide-imide, polyamide, and polysulfone.

The substrate to be used in the transfer recording medium according to the present invention is not particularly limited, but may be known material such as polyester, polycarbonate, triacetylcellulose, nylon, and polyimide in the form of, e.g., a film or sheet.

The transfer recording layer may preferably comprise 0.1 to 10% of a colorant, 20-95% of a functional component, 0.001-20% (based on the recording layer) of a reaction initiator (when contained in the functional component), and 0-80% of a binder.

In the image forming method according to the present invention, plural kinds of energies are applied to the transfer recording layer. In the following, there are summarized several modes of energy application to form a latent image to be transferred.

(1) Light and heat energies are imparted to the transfer recording layer, under such a condition that at least one of the light and heat energies corresponds to or is modulated by a recording information signal, thereby to form a latent image portion having a physical property such as a melting temperature, etc., which has changed from the energy application (2) A reaction initiator and a polymerizing component is disposed in the transfer recording layer in such an arrangement that they are mixed each other at a portion applied with a pressure (e.g., the reaction initiator is contained in capsules, which are ruptured under pressure to cause mixing between the reaction initiator and the polymerizing component), and the reaction initiator is activated only on heating. Pressure and heat energies are applied to the transfer recording layer with at least one of the energies corresponding to a recording information signal, thereby to form a latent image portion having a varied physical property.

(3) A reaction initiator activatable on light exposure alone and a polymerizing component are disposed in the transfer recording layer so as to be mixed with each other under application of a pressure. Pressure and light energies are applied to the transfer recording layer with at least one of the energies corresponding to a recording information signal, thereby to form a latent image portion having a varied physical property.

(4) A reaction initiator activatable on application of both heat and light energies and a polymerizing component are disposed in the transfer recording layer so as to be mixed with each other under application of a pressure. Pressure, heat and light energies are applied to the transfer recording layer with at least one of the energies corresponding to a recording information signal, thereby to form a latent image portion having a varied physical property.

The respective energies are generally provided in such amounts that they in combination provide a sufficient degree of change in transfer characteristic of the transfer recording layer, and more specifically, according to the following standards:

Heat: a level sufficient to provide a temperature of 30-180° C., preferably 70-120° C.;

Light: 10 $\mu J/cm^2$ -10 $mJ/cm^2$, preferably 20-200 $\mu J$ $cm^2$ at wavelengths of 250-600 nm, preforably 300-500 nm; and Pressure: e.g., a level sufficient to cause a rupture of microcapsules; generally 5-100 kg/cm$^2$, preferably 20-50 kg/cm$^2$.

Now, several system arrangements for practicing the image forming method according to the present invention will be explained with reference to FIGS. 3-8.

FIGS. 3-8 respectively show an apparatus whereby a latent image is formed in a transfer recording layer of a transfer recording medium and is transferred to a medium to be transfer-printed. Each apparatus comprises heating means, illumination (light exposure) means, and transfer means for transferring a latent image formed in a transfer recording layer to a medium to be transfer-printed. At least one of the heating means and illumination means is driven in response to image signals.

FIG. 3 is a schematic side view showing an apparatus for practicing the image forming method according to the present invention. More specifically, the apparatus shown in FIG. 3 is used for practicing a method wherein a plurality of heating elements in a single heating means are driven selectively and in response to image signals and different light beams respectively corresponding to colors of an image or elements of an image to be recorded are applied to at least the portions of the transfer recording layer heated by the driven heating elements to form a multicolor latent image to be transferred. Referring to FIG. 3, a transfer recording medium 1 according to the present invention comprises a film substrate 1b and a transfer recording layer 1a formed thereon, the melting temperature or softening temperature of which increases when illuminated with light under the state where it is melted or softened. The transfer recording medium 1 is wound about a feed roller 2. An illumination means 3 disposed to illuminate the transfer recording medium 1 with light may be a low-pressure mercury lamp, a high-pressure mercury lamp, a metal halide lamp, a fluorescent lamp, a Xenon lamp, etc. Opposite to the illumination means 3 with respect to the transfer medium 1 is disposed a heating means 4 such as a thermal head which is controlled by a control circuit 5 to generate heat pulses. Instead of an ordinary thermal head, a current-conduction type self-heat generative transfer recording medium which generates heat due to a current passing therethrough may also be used. In this case, the heating means 4 is composed as a current head which generates electric pulses passing through the medium. The heating means 4 is provided with a plurality of heating elements (equal to resistance heating elements 20a, 20b, . . . shown in FIGS. 2A, 2B, . . . when the heating means is a thermal head, and unit electrodes when the heating means is a current head). The heating elements may be arranged in a single row, in matrix or in a plurality of rows. Further, the heat elements may respectively be discrete ones, or may be parts of a continuous bar-shaped resistance heating member provided with discrete electrodes.

The apparatus further includes transfer means comprising a heat roller 8 provided with a heater 7 inside thereof and a pinch roller 9 disposed opposite to the heat roller 8 so as to pinch a laminate of the transfer recording medium 1 and a medium to be transfer-printed 10 such as plain paper or an OHP sheet (overhead projection transparency), and a windup roller 10 about which the transfer medium 1 after the transfer operation is wound up. The recorded image 12 corresponding to the latent image is transferred from the transfer medium 1 and formed on the medium 10.

The transfer medium 1 sent from the supply roller 2 is applied with heat pulses by the thermal head 4 based on image signals supplied to the control circuit 5. Simultaneously with the application of heat pulses to the transfer medium 1, different wavelengths of light are successively issued from the lamp 3 in synchronism with the heat pulses based on the (color) image signals. The principle of latent image formation is the same as explained with reference to FIGS. 2A to 2D. The lamp 3 in the figure is schematically depicted and may be composed of a plurality of lamps issuing different wavelengths of light. More specifically, if one spectral region of light is supplied from one lamp, lamps are required in a number equal to that of the colors of the image forming elements.

A latent image portion is formed in the transfer recording layer 1a by means of the thermal head 4 and the lamp 3 and is transferred to the medium to be transfer-printed 10 when passed through the heat roller 8 and the pinch roller 9.

In this case, basically a single selective heating means such as a thermal head is controlled based on image signals, so that the control circuit can be made a simple one. As a result, it is easy to realize a small-sized highly reliable apparatus and also stable image formation.

Further, it is also possible to control both the heating and illumination based on image signals. For example, this may be realized by heat is applied in the manner as described above with reference to FIGS. 2A-2D while light is thrown upon positions corresponding to the energized resistance heating elements. In other words, light is uniformly illuminated in the embodiment shown in FIGS. 2A-2D, whereas light is controlled so as to be coincidently thrown upon the heat-generated parts of the thermal head in the case where both heating and illumination are controlled. In this manner, in a case where image forming elements having sensitivities to particular wavelengths, wavelengths of light beams are successively changed, whereas in a case where image forming elements having sensitivities to particular temperatures, the image forming elements are heated to different temperatures depending on their colors.

The mode wherein both heating and illumination are controlled as described above is advantageous in order to obtain a large contrast or change in transfer characteristic of a latent image, whereby a sharp image can be obtained easily. Further, even if one type of sensitivity characteristic or contol-lability is deteriorated, an accompanying deleterious effect may be half reduced, so that a reliable apparatus can be easily obtained.

Formation of a multi-color image has been explained in the above, but a monocolor image can also be obtained by the apparatus shown in FIG. 3, if a single colorant is used in the transfer recording layer 1a. This is also true with the apparatus which will be explained hereinafter.

Figure 4:
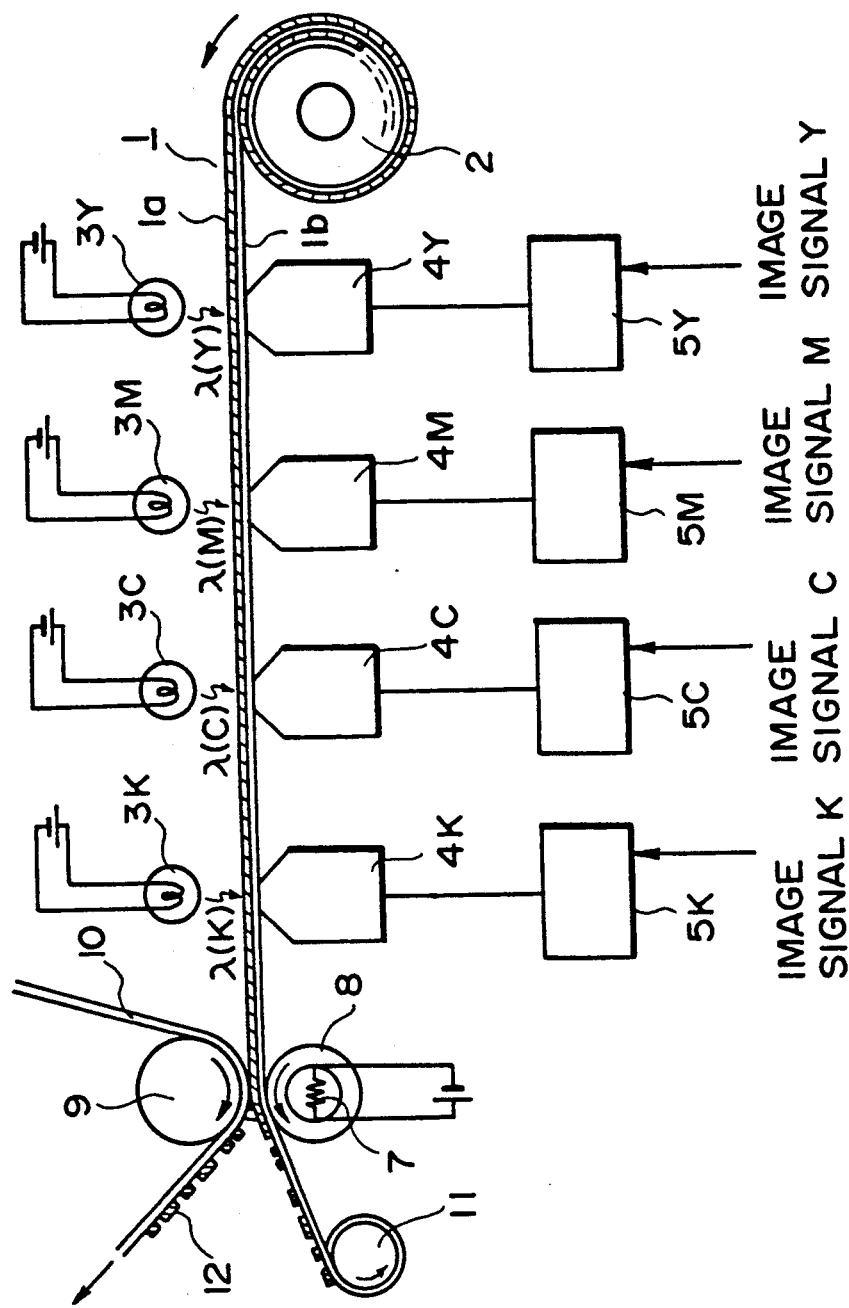

According to an embodiment of the image forming apparatus of the present invention, the formation of a latent image can be effected in a plurality of steps. This embodiment is shown in FIG. 4. Referring to FIG. 4, the apparatus comprises a latent image formation section and a transfer means for transferring a latent image formed in the latent image formation section. The latent image formation section comprises a plurality of latent image formation units each comprising one heating means and one illumination means, and each latent image formation section is responsible for one color of latent image. In the embodiment shown in FIG. 4, a yellow latent image is formed by a lamp 3Y as an illumination means and a thermal head 4Y as a heating means; a magenta latent image is formed by a lamp 3M and a thermal head 4M; a cyan latent image by a lamp 3C and a thermal head 4C; and a black latent image by a lamp 3K and a thermal head 4K. Thus, respective colors of latent image formation are successively conducted to provide a multi-color latent image which is then transferred onto a medium to be transfer-printed 10 to form a multi-color image.

This embodiment involving a plurality of latent image formation steps is advantageous in realizing a high speed apparatus. Particularly, when heating means such as thermal heads are used corresponding to image signals, the heating means are subjected to high speed repetition of heating and cooling. Now, it is assumed that a period of 4 m.sec. is required for one cycle of heating and cooling of a heating means. Then, in a case where a single latent image formation step is involved and 4 cycles of heating and cooling are effected one for each of Y (yellow), M (magenta), C (cyan) and K (black) latent image formation steps, at least a period of 4 m.sec×4=16 m.sec is required for scanning of one line. On the contrary, if 4 latent image formation steps are involved each responsible for formation of one of Y, M, C and K latent images, only 4 m.sec is required for scanning of one line because of parallel processing. In this way, high speed processing is easily conducted, so that a high speed multicolor recording apparatus can be realized.

On the other hand, the foredescribed embodiment involving a single latent image formation step has an advantage that a clear multi-color image can be obtained, because multi-colors of an image are effected at a part in principle whereby color deviation hardly occurs.

Figure 5:
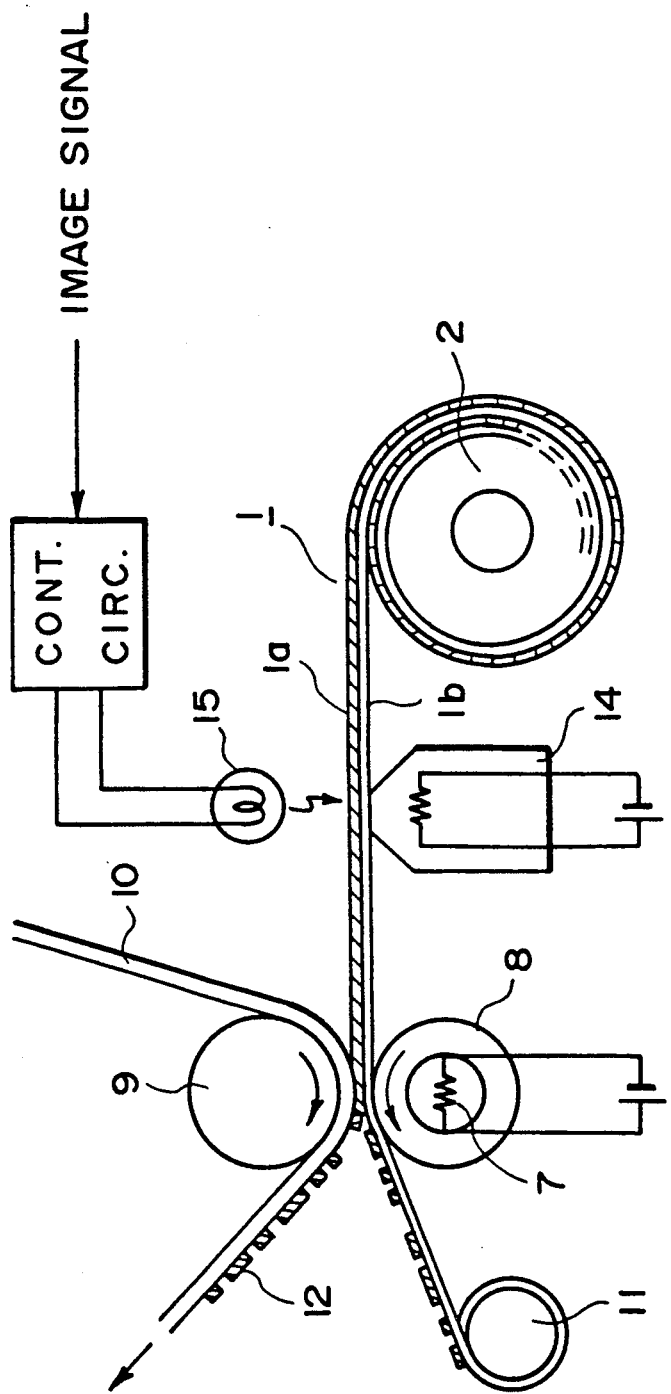

FIG. 5 shows an apparatus for practicing another embodiment of the image forming method according to the present invention. In the embodiment shown in FIG. 5, light illumination is controlled based on image signals, while heat is uniformly applied. More specifically, referring to FIGS. 2A-2D, the entire thermal head 20 is energized instead of resistance heating elements 20b, 20d, 20e and 20f, the portions of the transfer recording layer corresponding to the resistance heating element 20b, 20d, 20e, and 20f is illuminated by a light beam with a wavelength λ(Y). Likewise, the portions corresponding to the resistance heating elements 20a, 20e and 20f are illuminated by a light beam with a wavelength λ(M). Illumination by light beams with λ(C) and λ(K) is effected in a similar manner.

As a result, a heating means 14 is a heater for uniformly heating the transfer recording medium which may be a heat roller like the one denoted by reference numeral 8 or may be one obtained by a heater element disposed on a ceramic substrate. Of course, it is also possible to provide the heating means 14 with a temperature sensor and a feed-back temperature control circuit for the purpose of accurate control of heating temperature. On the other hand, an array of lamps 15 are provided to effect light illumination based on image signals. The type of the lamp array 15 may be selected according to the spectral sensitivity region of the transfer recording layer 1a and may be an LED array, a laser array or a liquid crystal shutter array for the visible spectral region. Further, a laser beam scanning system, may be used instead of a lamp array. If the transfer recording layer has a sensitivity to an ultraviolet region, an ultraviolet lamp array or an optical system for scanning ultraviolet may be used.

According to the embodiment shown in FIG. 5, a high quality of image can be easily attained at a high speed, a light beam which is an energy source essentially excellent in response characteristic and with low diffusivity is controlled based on image signals.

Figure 6:
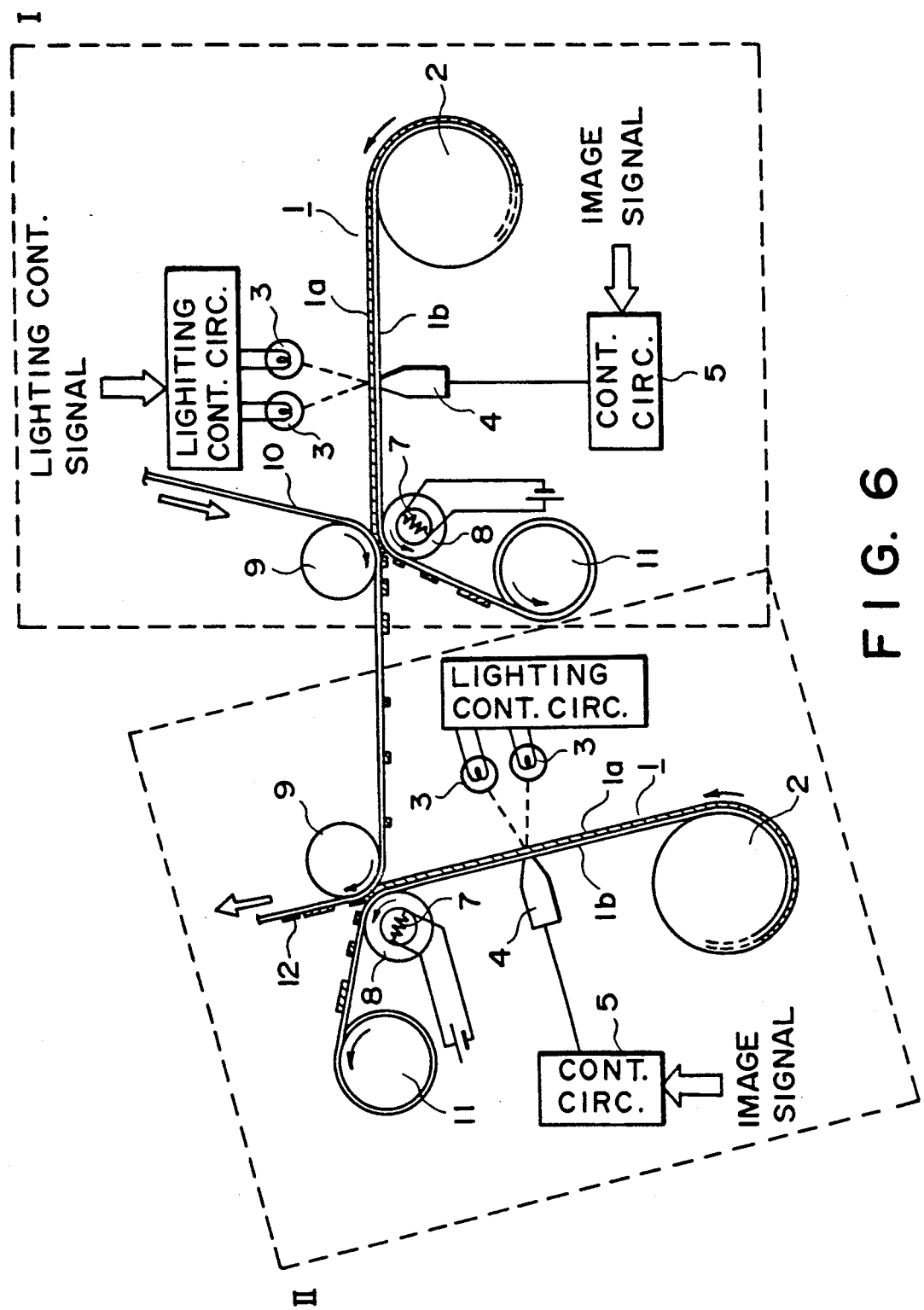

FIG. 6 shows another embodiment of the apparatus for practicing the image forming method according to the present invention, wherein a plurality of recording units are provided, each comprising a latent image formation unit and a transfer means. More specifically, a heating means, an illumination means and a transfer means are combined to form a recording unit, and such recording units are used in plurality. The combination of latent image formation and transfer is repeated in the respective recording units on a medium to be transfer-printed to form an image comprising a combination of repetitively transferred images.

Referring to FIG. 6, in a recording unit I, an image of two colors (in this embodiment) is formed on a medium 10, and thereafter in a second unit II, an image of different two colors is formed by transfer onto the same medium 10 to obtain a four-color image. It is of course possible to form a single color of image in respective recording units. Alternatively, it is also possible to practice a mode wherein an image in, e.g., three colors of Y, M and C is formed in the recording unit I and a black image is formed in the recording unit II which may be superposed, as desired, on the above three color image to obtain a four full-color image. Other modifications are also possible.

This embodiment wherein latent image formation and transfer are effected in each of a plurality of recording units, in advantageous in realization of a high speed system, and improved color separation.

Incidentally, in the embodiments shown in FIGS. 3-6, it is possible to effect the heating and the illumination sequentially, one after the other. Further, the heating and the illumination can be conducted on the same face of the transfer recording medium, or the application of the heating and the illumination may be effected on the respectively reverse faces of the transfer recording medium from those shown in the Figures.

Further, the colorant contained in the transfer recording layer or image forming elements can be a color precursor or a developer for developing the color precursor. In this case, the color formation may be effected in any of the latent image formation step, the transfer step, and a step after the transfer step. It is also possible to provide a developer to a medium to be transfer-printed so as to cause color formation in combination with a color precursor contained in the transferred image. Examples of such color precursors include leuco dyes and diazo compounds.

On the other hand, when colorants such as pigments and dyes causing no color formation reaction are used, transfer recording mediums having a better storability and excellent stability of images after recording can be attained. Further, it is easy to obtain a high quality multi-color image with a good color reproducibility.

Figure 7:
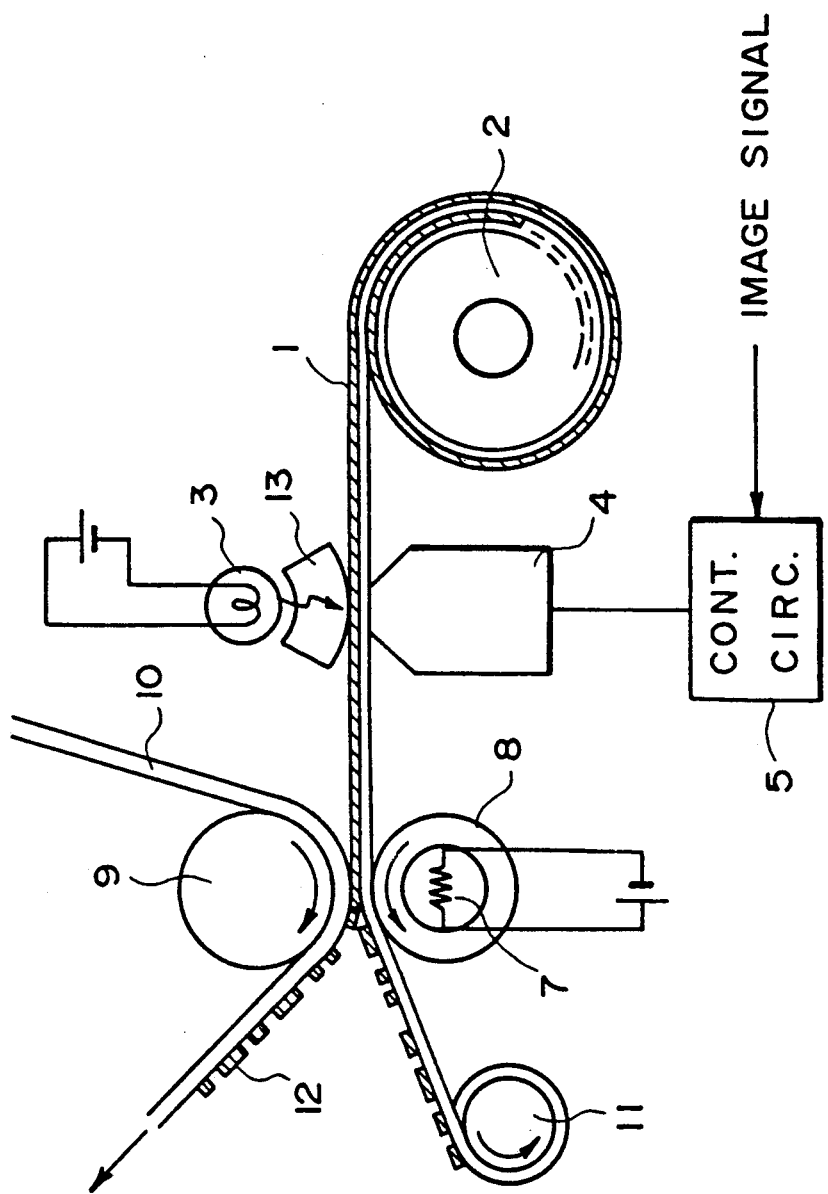

FIG. 7 shows an apparatus for practicing a process embodiment wherein a latent image is formed by using light, heat and pressure in combination. The transfer recording medium 1 has a transfer recording layer on a substrate. The transfer recording layer comprises capsules, through the rupture of which a photoreaction initiator is caused to mix with a polymerizing component, so that the transfer recording layer is caused to have an increased softening point, melting point, etc., when provided with light and heat energies. An ultraviolet-transmissive pressing member 13 is formed of, e.g., quartz glass and is provided for uniformly applying a pressure as described above to the transfer recording medium 1 to rupture the capsules. The other members are similar to those shown in FIG. 3.

Incidentally, if the transfer recording medium 1 has a transfer recording layer capable of producing latent images with only heat and pressure, the light source 3 need not be driven.

Figure 8:
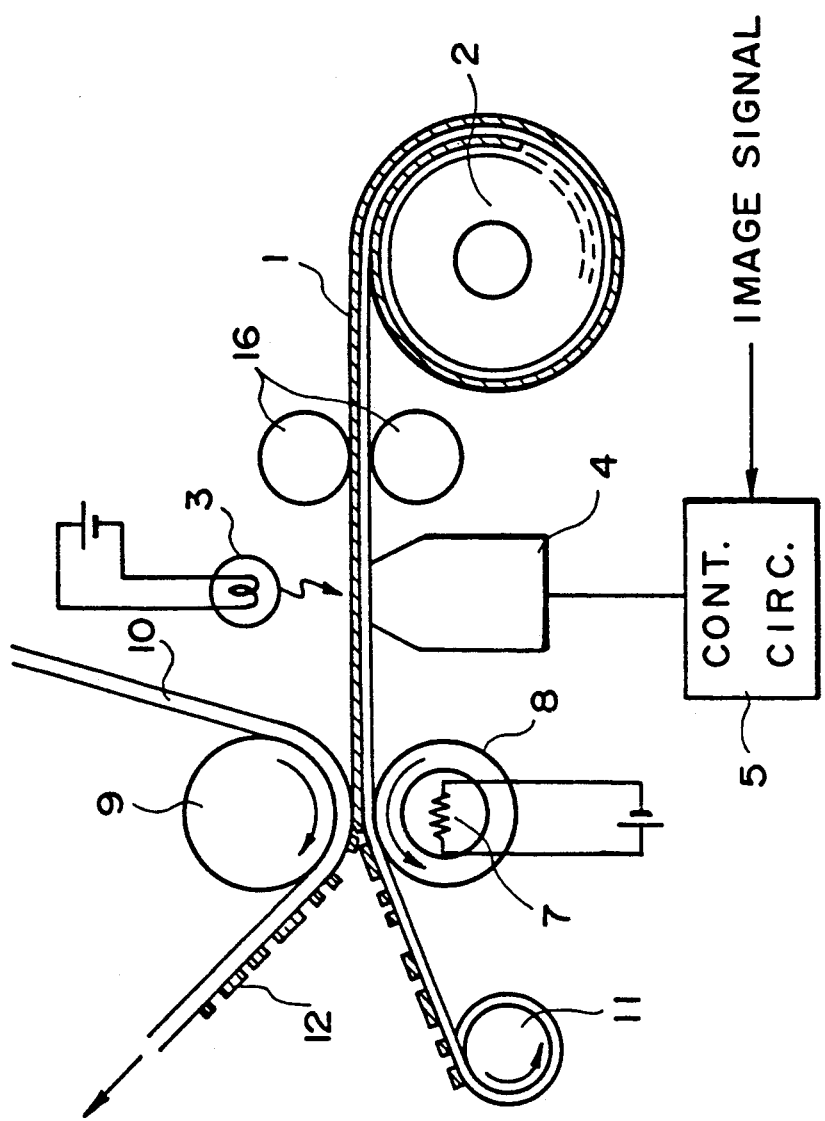

FIG. 8 shows an apparatus for practicing a process embodiment wherein a preliminary step is provided before a latent image formation step. In the embodiment shown in FIG. 8, a pair of pressing rollers 16 by which a transfer recording medium 1 similar to the one shown in FIG. 7 is brought into a state where it can be reactive on exposure to light and heat energies.

The present invention provides many advantages as described below. As the present invention uses a transfer recording medium which abruptly causes an irreversible change in transfer characteristic when provided with a plurality of energies, e.g., light and heat energies, improved stability against change in environmental conditions is obtained and highly refined images can be obtained stably, compared with conventional methods such as one using only heat which is susceptible to environmental temperature change or one using a transfer recording medium which causes a change in characteristic on application of only light energy. Further, for the same reason, the storability of the transfer recording medium as well as that of recorded images can be improved.

Further, as compared with a conventional method using only a single kind of energy such as heat, in which the recording speed is controlled by the heat response characteristic of the system or in which a long period of time is required because an amount of energy required for image formation is provided by a single kind of energy, the method according to the present invention is adapted for high speed recording because a plurality of energies are used to control the transfer characteristic.

Further, as a latent image is formed by a combination of plural kinds of heat energies, it is easy to control stepwise the stages of change in transfer characteristic for formation of a latent image so that a medium tone recording can be realized.

Further, according to a multi-color image formation mode of the method of the present invention, a multi-color transfer image can be easily formed by successively irradiating different wavelengths of light respectively in short periods. Compared with a conventional multi-color heat-sensitive transfer recording method wherein a transfer recording medium is subjected to complex movement, the multi-color image forming method according to the present invention does not require a complex movement of a transfer recording medium or a medium to be printed, so that a multi-color image can be obtained at a high speed.

The latent image formation step and the transfer step are independent from each other. Therefore, transfer conditions as required for stably providing a high quality transferred image on a medium to be printed can be freely and independently of the conditions for latent image formation. As a result, the medium to be printed may be not only plain paper as a matter of course but also selected from a wide variety media inclusive of paper having poor surface smoothness and a transparency film, on which a high quality image can also be produced. Further, an excellent fixation characteristic is also provided.

In the image forming method according to the present invention, the latent image formation step and the transfer step are separated, and a latent image is already formed in the transfer recording layer before the transfer step. As a result, the transfer step is released from restriction of imagewise and selective provision of energy. Thus, in the transfer step, a level of energy sufficient for providing a clearly transferred image on a medium to be transfer-printed depending on the surface state of the medium. The latent image formed in the transfer recording layer is not a mere reversible image such as a heat-fusion image but an irreversible image obtained by changing a physical property controlling a transfer characteristic, so that the transfer step can be effected reliably and faithfully to the latent image by utilizing the difference in the physical property before and after the change during the transfer step. When a heat fusion image is used as a latent image as in a conventional thermal transfer recording method, the heat-fusion image is required to be retained in a complete form from the latent image formation step to the transfer step. However, the fading of the image is inevitable because of decrease in transferability due to cooling between the two steps and heat conduction to the peripheral portion around the heat fusion image.

In the present invention, however, a latent image is formed through an irreversible and imagewise change in a physical property controlling transfer characteristic such as the softening point, melting point and viscosity at a same temperature of the transfer recording layer, so that the physical property change is reliably memorized until the transfer step. Further, unless any energy changing the physical property is provided after the latent image formation step, lowering in transferability or fading of a latent image is not caused. For this reason, even in a case where the surface smoothness of the medium to be printed is low, a high quality image can be formed and transfer can be effected without causing degradation of image quality.

According to the image forming method of the present invention, a multi-colored transfer image can be formed without requiring complex movement of the transfer recording medium or the medium to be printed. The multi-color transfer recording medium used in the image forming method according to the present invention has a transfer recording layer in which different colors of image forming elements are distributed, and a latent image of desired colors may be formed by changing conditions of providing plural kinds of energies and transferred onto the medium to be transferprinted. Accordingly, by changing the condition of providing plural kinds of energies sequentially in short periods, a multi-color transferred image can be obtained at a high speed without requiring complex movement of the transfer recording medium or the medium to be printed and while moving the medium to be printed in a single direction.

According to the image forming method of the present invention, color deviation does not occur in one picture element so that a very clear image is obtained as a whole.

In the image forming method according to the present invention, the provision of signalized energy and the provision of uniform energy is functionally separated, so that the conditions for energy provision are moderated, compared with a conventional thermal transfer recording method wherein the signalized energy for latent image formation is also used as a energy for transfer. More specifically, in the present invention, the amount of energy for latent image formation is only that required for causing a physical property change leading to an irreversible change in transfer characteristic while the energy for transfer can be provided by a nonsignalized uniform energy. Thus, the amount of energy for latent image formation and the amount of energy for transfer can be determined respectively independently, so that the conditions for energy application are moderated and a high speed recording can be easily realized.

A thermal head used in the conventional thermal transfer recording method has a heat response speed of 1-5 m.sec. at the fastest. When a thermal head is driven in a shorter repetition cycle, the heating and cooling cannot be effected sufficiently in the cycle to result in insufficient heating or remaining heat due to insufficient cooling which leads to degradation of image quality. This is one of the most serious obstacles to realization of high speed operation. On the contrary, in the present invention wherein plural kinds of energies are used, when a thermal head and light illumination are combined, the influence of insufficient cooling or remaining heat of the thermal head is removed or moderated, because the latent image formation may be proceeded only when the illumination is combined with the heat from the thermal head. As a result, even a conventional thermal head may be used for a recording operation in a shorter cycle by that much, so that high speed recording can be easily realized by the present invention.

As a latent image is formed through provision of plural kinds of energies in the present invention, the physical property change for forming a latent image can be easily adjusted stepwise, compared with a conventional method wherein only heat energy is used for formation of a latent image. Further, as one of the plural kinds of energy, such an energy source as light adapted for stepwise control of the intensity may be used, it is easy to form an image with a medium tone. For example, if three steps of illumination intensity or time is combined with heating, four steps of gradation (3 steps+no heating) becomes possible.

While it is also desirable that such control is effected at a high speed, the use of an energy such as light having a high response speed in combination makes possible a high-speed medium tone recording.

Futher, by using distributed image forming elements for constituting a transfer recording layer, separation of the transfer recording layer is promoted to provide a clear transferred image.

Futher, as the energy for latent image formation is shared by plural kinds of energies, individual energies need not be applied so much, whereby a compact apparatus can be realized.

Hereinbelow, the present invention will be described by way of examples.

EXAMPLE 1

TABLE 1

| Item | Component | wt. % |
|---|---|---|
| Binder | poly(4,4'-isopropylidene-diphenylene-1,1,3 trimethyl-3-phenylindane-5,4'-dicarboxylate: p,p'-dihydroxy- | 50 |

TABLE 1-continued

| Item | Component | wt. % |
|---|---|---|
| (Polymerizing component) Polymerizable monomer | biphenyl azelate) (25:75) tri(6-acryloyloxyhexyl)-1,3,5-benzenetricarboxylate | 20 |
| Reaction initiator | benzophenone + Michler's ketone (1:6 mixture) | 8 |
| Stabilizer | hydroquinone | 2 |
| Colorant | carbon black | 20 |

The components shown in Table 1 were mixed in chloroform (solvent) and applied under a light-shielding condition onto a 6 microns thick polyimide film by solvent coating method and dried to form a transfer recording medium according to the present invention. The transfer medium was wound up in a roll and set in an apparatus as shown in FIG. 3.

The thermal head 4 was one of a line type of 8 dots/mm - A4 size having a row of resistance heating elements at its edge portion. The thermal head 4 was disposed so as to contact the base film 4 side of the transfer medium 1 and in such a manner that the transfer medium 1 was pressed to the heating elements due to a tension applied to the transfer medium.

Opposite to the thermal head 4 and 2 cm spaced apart from the transfer medium 1 was disposed a high pressure mercury lamp 3.

Then, the thermal head 4 was energized while being controlled based on image signals. In this example, the parts of the transfer recording layer 1a provided with light and heat were caused to have an increased transfer initiation temperature and an increased glass transition point, whereby a negative type of recording was effected. More specifically, the thermal head 4 was controlled in such a manner that it was not energized in response to a mark signal (black) but was energized in response to a non-mark signal (white) to generate heat at a current energy of 0.8 W/dot×2.0 m.sec. In this way, while effecting uniform illumination with a high pressure mercury lamp, the thermal head was driven under control based on image signals at a repetition cycle of 5 m.sec/line, in phase with which the transfer recording medium was conveyed by means of a stepping motor and a driving rubber roller.

After a latent image portion was formed in the transfer recording layer 1a, plain paper having a surface smoothness in the range of 10-30 seconds was superposed on the transfer recording layer and the resultant laminate was conveyed through a heat roller 8 and a pinch roller 9. The heat roller 8 was an aluminum roller having a 300 W-heater inside thereof and covered with a 2 mm-thick silicone rubber layer. The surface temperature of the heat roller 8 was controlled at 100° C. by the heater. The pinch roller 9 was one made of silicone rubber (having a hardness of 50° according to measurement by JIS rubber hardness meter) and controlled to exert a pressure of 1-1.5 kg/cm². The thus obtained transfer image on plain paper was clear and of a high quality with good fixation characteristic.

EXAMPLE 2

The components shown in Table 2 below were mixed in dichloromethane (solvent) to form a solution at a concentration of about 10%. Therefore, the solution was applied by means of an applicator on a 6 microns-thick aramide film under a light shielding condition and dried to form a transfer recording layer in a thickness of 5 microns. On the transfer recording layer was further formed a 5 microns-thick oxygenshielding layer for preventing suppression of radical reaction of the transfer recording layer due to oxygen by applying a 10%-aqueous solution of polyvinyl alcohol (PVA) containing a small account (about 0.1%) of fatty acid alkylol amide (surfactant) by means of an applicator, whereby a transfer recording medium according to the present invention was obtained.

TABLE 2

| Item | Component | wt. % |
|---|---|---|
| (Polymerizing component) Polymerizable prepolymer | $\mathrm{+(C(CH_3)-CH_2)+(C(CH_3)-CH_2)+}$ with $C=O$, $O$, $CH_3$ and $C=O$, $O$, $CH_2-CH(OH)$ side groups; $\overline{Mw} = 5 \times 10^3$ *1 | 90 |
| Reaction initiator | Michler's ketone | 1 |
|  | Benzophenone | 6 |
| Colorant | Kayaset Blue 136 | 3 |

*1 100 g of methyl methacrylate and 100 g of glycidylmethyl methacrylate was copolymerized in 1 liter of benzene in the presence of N,N'-azoisobutyronitrile (initiator) at 60° C. for 30 min. The resultant copolymer was again dissolved in 1 liter of benzene, to which 50 g of acrylic acid and 5 g of hydroquinone were added, and the mixture was stirred at 60° C. for 2 hours to prepare a polymerizable prepolymer shown in Table 2. The molecular structure of the prepolymer was found to be as shown in the table through the infrared analysis.

The transfer medium obtained in the above manner was wound up in a roll and set in an apparatus as shown in FIG. 3. The thermal head 4 was a line type-one of 8 dots/mm - A4 size. The light source 3 was a fluorescent lamp having a peak wavelength 370 nm. To the thermal head 4 was applied a power of 0.06 W/dot and a pulse duration of 50 m.sec. in a cycle of 400 m.sec. corresponding to image signals. The fluorescent lamp was used to effect a uniform illumination at an intensity of 15 mW/cm² and a pulse duration of 50 m.sec. in synchronism with the thermal head.

After latent image thus formed in the transfer recording layer during the latent image formation step, the transfer recording medium was once taken out of the apparatus shown in FIG. 3 and subjected to washing with water to remove the oxygen shielding layer. Then, the transfer recording medium having the latent image was incorporated in the apparatus shown in FIG. 3 and conveyed to the transfer step.

In the transfer step, the pressure between the heat roller 8 and the pinch roller 9, the structures of which were the same as those used in Example 1, was set at 25 kg/cm². The surface temperature of the heat roller 8 was controlled at 130±10° C. The medium to be transfer printed used in this example had a surface smoothness in the range of 10–30 sec.

The transfer image thus obtained on the medium to be transfer printed was clear and of a high quality.

EXAMPLE 3

A transfer recording medium according to the present invention was prepared in the same manner as in Example 2 except that the components shown in Table 3 below were used instead of those shown in Table 2.

TABLE 3

| Item | Compound | wt. % |
|---|---|---|
| Binder | Polymethyl methacrylate (Elvasite 2041) | 35 |
| (Polymerizing component) Polymerizable monomer | Triazine-trione ring with three $CH_2CH_2COOCH=CH_2$ substituents (i.e., $CH_2=CHCOOCH_2CH_2-N$, $-N-CH_2CH_2COOCH=CH_2$, and $-N-CH_2CH_2COOCH=CH_2$ on the ring with three C=O groups) | 50 |
| Reaction initiator | Irgacure 907 (mfd. by Ciba-Geigy Corp.) | 8 |
| Colorant | Diaresin Red K (mfd. by Mitsubishi Kasei Kogyo K.K.) | 7 |

The transfer recording medium was used in the same manner as in Example 2 to produce a transferred image on plain paper having a surface smoothness in the range of 10–30 sec. However, to the thermal head 4 was applied a power of 0.05 W/dot at a cycle of 100 m.sec and a pulse duration of 35 m.sec based on image signals. Further, a fluorescent lamp having a peak wavelength of 313 nm was used as the light source 3 and driven for uniform illumination at a luminance of 8 mW/cm² and a pulse duration of 50 m.sec in synchronism with the thermal head 4.

EXAMPLE 4

A transfer recording medium according to the present invention was prepared in the same manner as in Example 2 except that the components shown in Table 4 were used in place of those shown in Table 2 and a 5 microns thick PET film was used as the substrate. Incidentally, the polymerizable monomer shown in Table 4 had a melting temperature of about 60° C.

TABLE 4

| Item | Component | wt. % |
|---|---|---|
| Binder | polymethyl methacrylate (Elvasite 2041) | 25 |

TABLE 4-continued

| Item | Component | wt. % |
|---|---|---|
| (Polymerizing component) Polymerizable monomer | 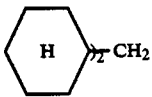 | 55 |
| Reaction initiator | 3,3',4,4'-tetra(t-butylperoxycarbonyl)benzophenone | 10 |
|  | Michler's ketone | 5 |
| Colorant | Diaresin Red K (mfd. by Mitsubishi Kasei Kogyo K.K.) | 5 |

The transfer recording medium was used in the same manner as in Example 2 to produce a transferred image on plain paper having a surface smoothness in the range of 10–30 sec. However, to the thermal head 4 was applied a power of 0.18 W/dot at a cycle of 5 m.sec and a pulse duration of 2 m.sec based on image signals. Further, a fluorescent lamp having a peak wavelength of 370 nm was driven for uniform illumination at a luminance of 50 mW/cm² and a pulse duration of 2/4 m.sec in synchronism with the thermal head.

EXAMPLE 5

The components shown in Table 1 were mixed in chloroform solvent in the dark and spray dried to form image forming elements. The particle sizes of the image forming elements were almost in the range of 3–20 microns. The image forming elements were caused to adhere under a light shielding condition onto a PET film already coated with an adhesive of a polyester resin at a thickness of about 1 micron.

The thus prepared transfer recording medium according to the present invention was used in the same manner as in Example 1 to form a transferred image on plain paper having a surface smoothness in the range of 10–30 sec.

The transfer image thus obtained on plain paper was clear and of a high quality with good fixation characteristic.

EXAMPLE 6

Microcapsules having a core of p-phenylene-bis(α-cyanobutadienecarboxylic acid) as a reaction initiator were prepared in the following manner.

10 g of a mixture of p-phenylenebis(α-cyanobutadienecarboxylic acid) and paraffin oil was mixed with a cationic or nonionic surfactant having an HLB of at least 10, 1 g of gelatine, 1 g of gum arabic and 200 ml of water, and the mixture was further stirred by means of a homomixer. Then, an aqueous ammonia solution was added to the mixture to adjust the pH to 11, whereby a microcapsule slurry was prepared. The slurry was subjected to solid-liquid separation by means of a Nutsche funnel, and the solid was dried at 35° C. for 10 hours in a vacuum drier to obtain powdery capsules with sizes in the range of 7–15 microns and an average of 10 microns, which comprised a core of a mixture of the initiator and the paraffin oil encapsulated with an wall of gelatine and gum arabic.

10 parts of the microcapsules, 85 parts of an unsaturated polyester represented by the formula below and 5 parts of carbon black were mixed together in a solvent and applied onto a 6 microns-thick PET film under a light-shielding condition to form a transfer recording medium having a transfer recording layer of about 10 microns in thickness.

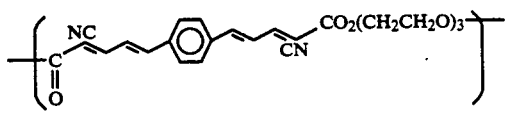

The thus prepared transfer recording medium was wound up about a roller and set in an apparatus as shown in FIG. 7 wherein the thermal head 4 was replaced by a pressure roller surfaced with silicone rubber. The pressure between the pressure roller and a glass pressing member 13 was set to about 4 kg/cm². An Ar laser having a wavelength of 488 nm was used as the light source 3 and irradiated at an energy of about 5 mJ/cm² through a polygon mirror for scanning based on image signals. The transfer was effected by using a heat roller 8 and a pinch roller 9 which were the same as those used in Example 1 and set to exert a pressure of 1 kg/cm². The surface temperature of the heat roller 8 was controlled within the range of 100–120° C.

In this way, a clear transfer image was formed on plain paper having a surface smoothness of 10–30 sec.

EXAMPLE 7

Microcapsules containing p-phenylenebis(α-cyanobutadienecarboxylic acid) and having an average particle size of 4 microns were prepared in the same manner as in Example 6. The microcapsules in an amount of 10 parts were mixed with 85 parts of the unsaturated polyester used in Example 6 and 5 parts of carbon black in a solvent and spray-dried to obtain particulate image forming elements having an average particle size of 10 microns.

The thus obtained image forming elements were caused to adhere onto a PET film preliminarily coated with an about 1 micron-thick adhesive layer of a polyester resin to prepare a transfer recording medium according to the present invention.

The thus prepared transfer recording medium was used to form a transfer image on plain paper having a surface smoothness of 10–30 sec., whereby a clear image was produced on the plain paper.

EXAMPLE 8

Microcapsules were prepared in the same manner as in Example 6 except that p-phenylenebis(α-cyanobutadienecarboxylic acid) was replaced by methyl ethyl ketone peroxide. The microcapsules in an amount of 10 parts were mixed with 85 parts of the unsaturated polyester and 5 parts of carbon black in an solvent, and the mixture was applied onto a 3.5 microns-thick polyimide film under a light-shielding condition to produced transfer recording medium according to the present invention having an about 10 microns-thick transfer recording layer.

The thus prepared transfer recording medium was wound up about a roller and set in an apparatus as shown in FIG. 7 and subjected to formation of a transfer image without operating the light source 3. The pressure between a glass pressing member 13 and a thermal head 4 was set to about 4 kg/cm². The thermal head 4 was a line-type one of 8 dots/mm - A4 size, to which was applied a power of about 0.15 mW/dot at a cycle of 20 m.sec and a pulse duration of about 3 m.sec based on image signals. The heat roller 8 was composed of an aluminum substrate coated with a 3 mm-thick silicone rubber layer with a hardness of 45° according to a JIS hardness meter and had heater inside thereof. The surface temperature of the heat roller 8 was controlled at 80–100° C. The pinch roller 9 was composed of a silicone rubber. The pressure between the heat roller 8 and the pinch roller 9 was set at 1 kg/cm².

In this way, a clear transferred image was formed on plain paper having a surface smoothness of 10–30 sec.

EXAMPLE 9

A transfer recording medium was prepared in the same manner as in Example 7 except that methyl ethyl ketone peroxide was used in place of p-phenylene-bis(α-cyanobutadienecarboxylic acid). By using the transfer recording medium thus prepared, a transfer image was formed on plain paper having a surface smoothness of 10–30 sec in the same manner as in Example 8, whereby a clear image was obtained on the plain paper.

EXAMPLE 10

The components shown in Tables 5 and 6, respectively, were separately mixed in chloroform (solvent) and spray-dried to provide two kinds of image forming elements of different colors respectively having particles sizes falling almost in the range of 8–12 microns.

TABLE 5

| Item | Component | wt. % |
| --- | --- | --- |
| Binder | poly(4,4'-isopropylidene-diphenylene-1,1,3-trimethyl-3-phenylindane-5,4'-dicarboxylate:p,p'-dihydroxybiphenyl azelate) (25:75) | 50 |
| (Polymerizing component) Polymerizable monomer | tri(6-acryloyloxyhexyl)-1,3,5-benzenetricarboxylate | 20 |
| Reaction initiator | ditertiarybutylperoxyisophthalate | 6 |
| Sensitizer | ![structure] | 4 |
| Colorant | Brilliant Carmine 6B | 20 |

TABLE 6

| Item | Component | wt. % |
| --- | --- | --- |
| Binder | poly(4,4'-isopropylidenediphenylene-1,1,3-trimethyl-3-phenylindane-5,4'-dicarboxylate:p,p'-dihydroxybiphenyl azelate) (25:75) | 50 |
| (Polymerizing component) Polymerizable monomer | tri(6-acryloyloxyhexyl)-1,3,5-benzenetricarboxylate | 20 |
| Reaction initiator | di-tertiarybutylperoxyisophthalate | 6 |
| Sensitizer | 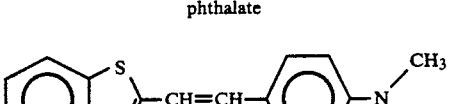 | 4 |
| Colorant | Phthalocyanine Green | 20 |

The sensitizer shown in Table 5 absorbed light in the range of about 350–440 nm to initiate the reaction. The sensitizer was yellowish and caused color-mixing with Brilliant Carmine 6B as the colorant to provide a color of red at the time of image formation.

The sensitizer shown in Table 6 absorbed light in the range of about 500–600 nm to initiate the reaction. The sensitizer showed a tint of magenta and caused color mixing with Phthalocyanine Green as the colorant to provide a color of black at the time of image formation.

The above prepared two kinds of image forming elements were uniformly dispersed in equal amounts in a binder, and the resultant mixture was applied on a 6 microns-thick polyimide film under a light-shielding conditions to form a transfer recording medium according to the present invention. The transfer medium was wound up in a roll and set in an apparatus as shown in FIG. 3.

The thermal head 4 was a line type-one of 8 dots/mm - A4 size having a resistance heating elements at its edge portion. The light source 3 included two 40 W-fluorescent lamps 3a and 3b having a spectral characteristic a and a spectral characteristic b, respectively, shown in FIG. 10 disposed 2 cm-spaced apart from the transfer medium. The fluorescent lamp 3a showing a spectral characteristic curve a was a fluorescent lamp for a diazo copier with a fluorescent material of $(SrMg)_2P_2O_7$: $Eu^{2+}$ which was optimum for the wavelength characteristic of the sensitizer but may be replaced by another fluorescent material such as $Sr_3(PO_4)_2:Eu^{2+}$ or $Sr_2P_2O_7:Eu^{2+}$. The fluorescent lamp 3b showing a spectral characteristic curve b was a green-color fluorescent lamp with a fluorescent material of $(La, Ce, Tb)_2O_3.0.2SiO_2.0.9P_2O_5$ which was selected because of a practical efficiency and an operation characteristic but may be replaced by another fluorescent material such as $MgAl_{11}O_{19}:CeTb$, or $Y_2SiO_5:CeTb$.

The heating elements of the thermal head 4 were energized under control by a control circuit 5 based on image signals. In this embodiment, the transfer recording layer 1a had such a property that the transfer initiation temperature increased when provided with light and heat through increase in glass transition temperature thereof, so that a negative type of recording was effected. In this embodiment, two-color recording of black and red was effected. Thus, the thermal head 4 was not energized in response to a mark signal (black or red) but was energized in response to a non-mark signal (white) to generate heat at a current energy of 0.8 W/dot×2.0 m.sec.

Figure 9:
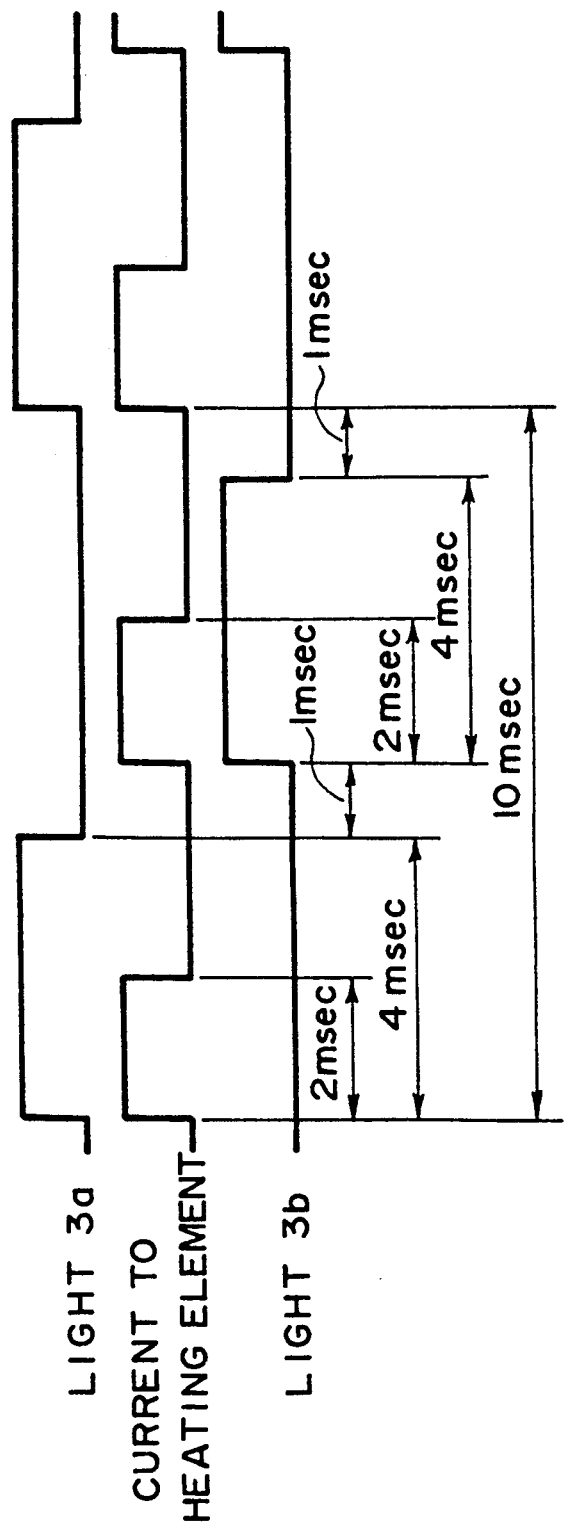
FIGS. 9 and 11 are respectively a timing chart for driving the energy sources used in an embodiment for practicing the image forming method according to the present invention.

FIG. 9 shows a driving timing chart for this embodiment.

First, a current was supplied for 2 m.sec not to resistance heating elements corresponding to an image signal of "red" but to resistance heating elements corresponding to an image signal of "white", while the fluorescent lamp 3a for diazo copier was simultaneously turned on to effect uniform illumination. The illumination time was 4 msec counted from the commencement of the energization of the resistance heating elements. After 1 m.sec from the termination of the illumination, i.e., after 5 m.sec from the start of energization of the heating elements, a current was supplied for 2 m.sec not to resistance heating elements corresponding to an image signal of "black" but to resistance heating elements corresponding to an image signal of "white", while the green-color fluorescent lamp 3b was simultaneously turned on to effect uniform illumination. The illumination time was equally 4 m.sec.

In the above described manner, the thermal head 4 was energized under control based on image signals of black, red, and white, while the transfer recording medium 1 was conveyed by the heat roller 8 and a stepping motor (not shown) in synchronism with the operation in a repetition cycle of 10 m.sec/line. After a latent image was formed in this way, a recording paper 10 which was plain paper with a surface smoothness of 10–30 sec was superposed onto the latent image bearing face of the transfer medium. The resultant laminate was conveyed through a heat roller 8 and a pinch roller 9. The heat roller 8 was an aluminum roller having a 300 W-heater inside thereof and covered with a 2 mm-thick silicone rubber layer. The surface temperature of the heat roller 8 was controlled at 90–100° C. by the heater. The pinch roller 9 was one made of silicone rubber (having a hardness of 50° according to JIS hardness meter) and controlled to exert a pressure of 1–1.5 kg/cm². The thus obtained two-color image on the plain paper was free of color deviation, had a high degree of saturation and clearness, and was a good quality of image with a good fixation characteristic.

EXAMPLE 11

A transfer recording medium according to the present invention was prepared using the components shown in Tables 7 and 8 given below in the following manner.

Thus, 0.55 part of particulate silica was dispersed in a mixture of 18 parts of 0.1N-hydrochloric acid and 20 parts of water. Then, 40 parts of the thus obtained dispersion was mixed with 55 parts of a 25%-solution of the components shown in Table 7 dissolved in methylene chloride, under stirring at room temperature by means of a homogenizer rotating at 4500 r.p.m. for 15 minutes. The dispersion was further stirred for 2 hours at 60° C. to form a dispersion of image forming elements.

The above operation was repeated by using the components shown in Table 8 in place of those shown in Table 7.

The thus obtained two kinds of image forming elements in dispersion were respectively formed to have a number-average particle size of 8.6 microns.

The thus obtained dispersions of two kinds of image forming elements were mixed in equal amounts, and the mixture was applied onto a PET film by means of an applicator under a light shielding condition so as to form substantially one layer of the image forming elements, followed by drying and heating at 100° C. to form a transfer recording layer composed of a melt-adhesion layer of the image forming elements onto the PET film.

Then, a PVA layer as an oxygen-shielding layer the same as that formed in Example 1 was formed in thickness of about 5 microns on the transfer recording layer to prepare a transfer recording medium according to the present invention.

TABLE 7

| Item | Component | wt. % |
| --- | --- | --- |
| Binder | polymethyl methacrylate (Elvasite 2041) | 22 |
| (Polymerizing component) Polymerizable monomer | $(CH_2=CHCOOCH_2CH_2O.CO.NH-\langle H \rangle_2-CH_2$ | 65 |
| Reaction initiator | 2-chlorothioxanthon ethyl-p-dimethylaminobenzoate | 4 6 |
| Colorant | Diaresin Red K (Mitsubishi Kasei Kogyo K.K.) | 3 |

TABLE 8

| Item | Component | wt. % |
| --- | --- | --- |
| Binder | Polymethylmethacrylate | 22 |

TABLE 8-continued

| Item | Component | wt. % |
| --- | --- | --- |
| | (Elvasite 2041) | |
| (Polymerizing component) Polymerizable monomer | $(CH_2=CHCOOCH_2.CH_2.O.CO.NH-\langle H \rangle_2-CH_2)$ | 65 |
| Reaction initiator | dichlorobenzophenone ethyl-p-dimethylaminobenzoate | 4 6 |
| colorant | Diaresin Yellow H.G. | 3 |

Figure 11:
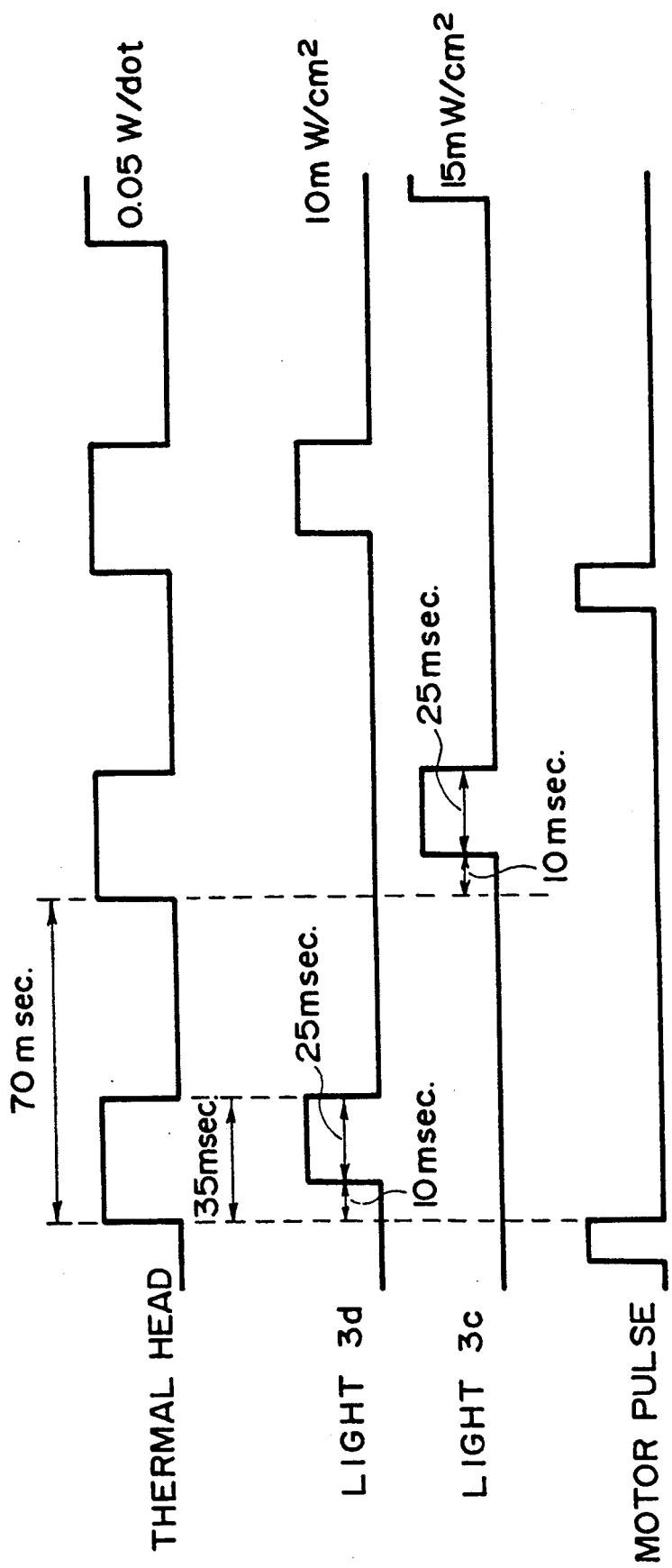

The thus prepared transfer recording medium was wound up in a roll, set in an apparatus ash shown in FIG. 3, and subjected to formation of a transfer image on plain paper having a surface smoothness of 10–30 sec in the same manner as in Example 2. FIG. 11 shows a driving sequence adopted for this operation. The light source 3 included a fluorescent lamp 3c having a peak wavelength of 313 nm and a fluorescent lamp 3d. The components shown in Table 7 are polymerized when irradiated by the light with a peak wavelength of 370 nm, and the components shown in Table 8 are polymerized when irradiated by the light with a peak wavelength of 313 nm. A power of 0.05 W/dot was supplied to the thermal head 4 in a cycle of 70 m.sec. and at a pulse duration of 35 m.sec. The fluorescent lamps 3c and 3d were turned on to effect uniform illumination at a pulse duration of 25 m.sec and at a luminance of 15 mW/cm$^2$ and 10 mW/cm$^2$, respectively. In FIG. 11 is also shown a pulse timing chart for a stepping motor driven for conveying the transfer recording medium.

In this way, a clear two-color image free of color deviation was formed on the plain paper.

EXAMPLE 12

The components shown in Tables 9–12 were separately mixed in a solvent and spray-dried in the same manner as in Example 10 to prepare 4 kinds of image forming elements respectively having particle sizes substantially falling in the range of 8–12 microns.

The sensitizer and/or reaction initiator contained in the compositions shown in Table 9–12 absorbed light in the ranges of about 280–340 nm, about 340–380 nm, about 380–450 n, and about 450–600 nm, respectively, thereby to initiate the reaction. Further, the compositions shown in Tables 9–12 gave the colors of black, cyan, yellow and magenta, respectively, at the time of the image formation.

TABLE 9

| Item | Component | wt. % |
| --- | --- | --- |
| (Polymerizing component) Polymer | polyvinyl cinnamate | 70 |
| Sensitizer | anthraquinone | 20 |
| Colorant | carbon black | 10 |

TABLE 10

| Item | Component | wt. % |
| --- | --- | --- |
| Binder | poly(4,4'-isopropylidene-diphenylene-1,1,3 trimethyl-3-phenylindane-5,4'-dicarboxylate: p,p'-dihydroxy-biphenyl azelate) (25:75) | 50 |
| (Polymerizing component) Polymerizable monomer | tri(6-acryloyloxyhexyl)-1,3,5-benzenetricarboxylate | 20 |
| Reaction initiator | benzophenone + Michler's ketone | 10 |
| Colorant | phthalocyanine blue | 20 |

TABLE 11

| Item | Component | wt. % |
| --- | --- | --- |
| Binder | poly(4,4'-isopropylidene-diphenylene-1,1,3-trimethyl-3-phenylindane-5,4'-dicarboxylate: p,p'-dihydroxybiphenyl azelate) (25:75) | 50 |
| (Polymerizing component) Polymerizable monomer | tri(6-acryloyloxyhexyl) 1,3,5-benzenetricarboxylate | 20 |
| Reaction initiator | benzoin | 10 |
| Colorant | Benzidine Yellow | 20 |

TABLE 12

| Item | Component | wt. % |
| --- | --- | --- |
| Binder | poly(4,4'-isopropylidenediphenylene-1,1,3-trimethyl-3-phenylindane-5,4'-dicarboxylate:p,p'-dihydroxybiphenyl azelate) (25:75) | 50 |
| (Polymerizing component) Polymerizable monomer | tri(6-acryloyloxyhexyl)-1,3,5-benzenetricarboxylate | 20 |
| Reaction initiator | di-ti-butylperoxyisophthalate | 10 |

TABLE 12-continued

| Item | Component | wt. % |
|---|---|---|
| Sensitizer initiator | (structure: $H_5C_2OOC$, $H_3C$, S, N, =CH—CH=, S, O, N—$CH_2COOK$, =S) | 10 |
| Colorant | Brilliant Carmine 6B | 10 |

Figure 12:
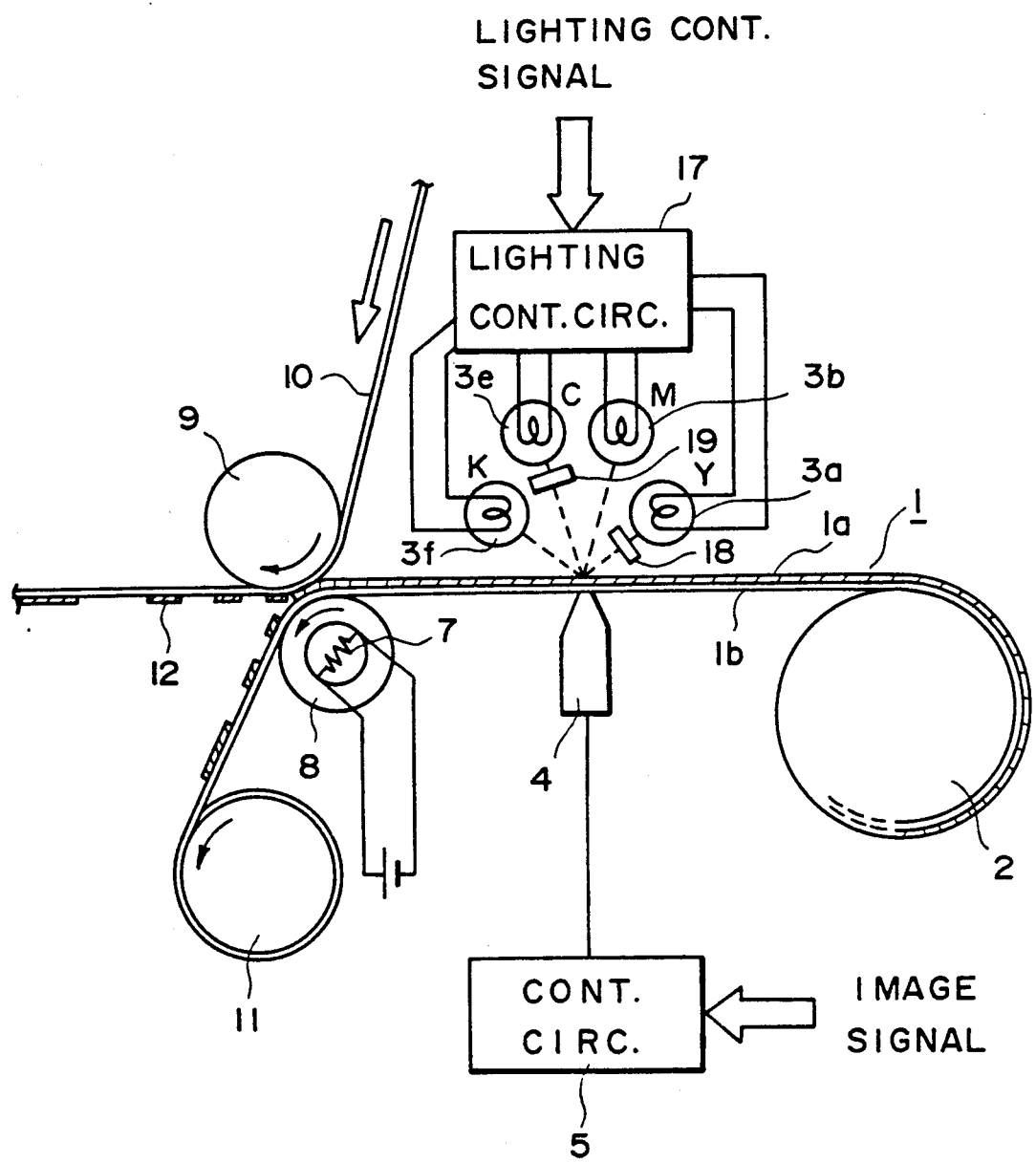

The above prepared four kinds of image forming elements were uniformly dispersed in equal amounts in a binder, and the resultant mixture was applied on a 6 microns-thick polyimide film under a light shielding condition to form a transfer recording medium according to the present invention. The transfer recording medium was wound up in a roll and set in an apparatus as shown in FIG. 12.

In this embodiment, the light source included a green color fluorescent lamp 3b as used in Example 10, a fluorescent lamp for diazo copier 3a as used in Example 10, a black light 3e (mfd. by Toshiba K.K.), and a health ray lamp 3f (mfd. by Toshiba K.K.). In front of the fluorescent lamp 3a, a sharp-cut filter (L-318) 18 was disposed, and in front of the black light 3e, a sharp-cut filter (1-1A) 19 was disposed, so as to provide desired spectral characteristics adapted for respective colors of image forming elements.

Figure 13:
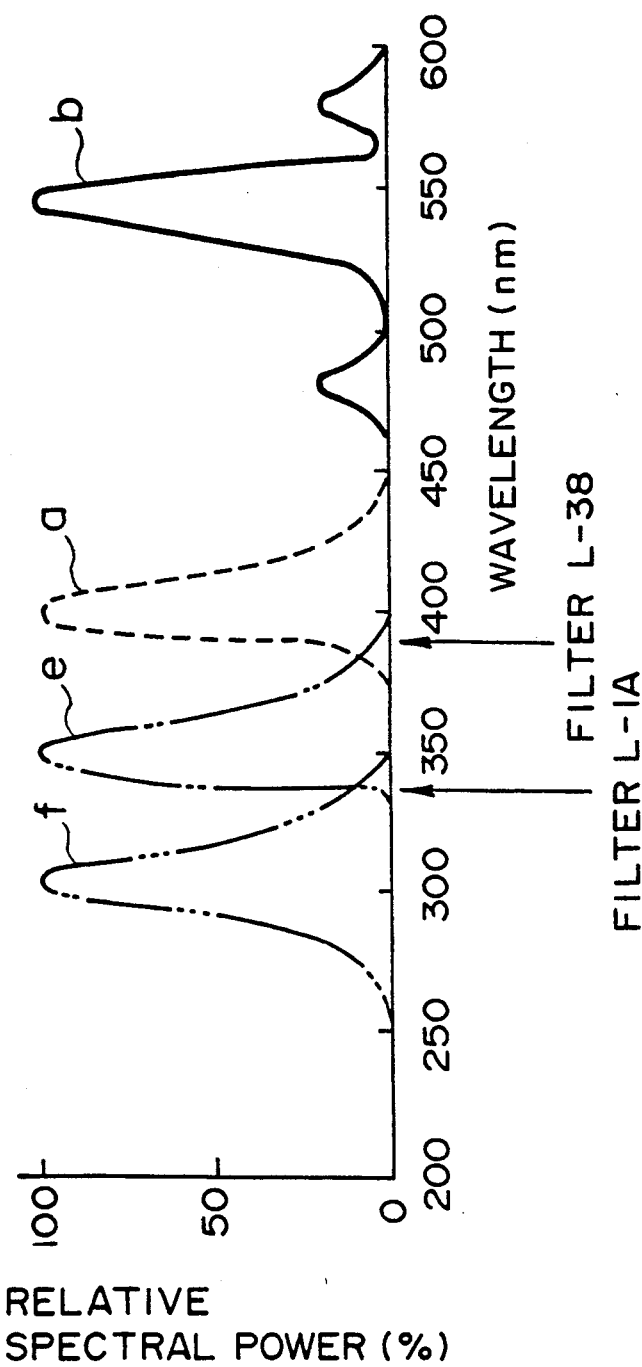

FIG. 13 shows the spectral characteristics of the respective light sources after modification with the use of sharp-cut filters as described above.

The thermal head 4 was the same as the one used in Example 10. The transfer recording layer of this example also had such a property that the transfer initiation temperature increased when provided with light and heat through increase in glass transition temperature thereof, so that a negative type of recording was effected.

In operation, a current was first supplied for 2 m.sec not to resistance heating element corresponding to an image signal of "yellow" but to those corresponding to an image signal of "white", while the fluorescent lamp for diazo sopier 3a was simultaneously turned on to effect uniform illumination. The illumination time was 4 m.sec. After 1 m.sec from the termination of the illumination, a current was supplied for 2 m.sec not to heating elements corresponding to an image signal of "magenta" but to heating elements corresponding to an image signal of "white", while the green-color fluorescent lamp 3b was simultaneously turned on to effect uniform illumination. The illumination time was 4 m.sec similarly as in the case of "yellow". In the same manner, the black light 3e was selectively turned on for "cyan" and the health ray lamp 3f was selectively turned on for "black", whereby a latent image was formed with respect to all of the four colors. The lamps 3a, 3b, 3e and 3f were controlled by means of a lighting control circuit 17.

In the manner as described above, the thermal head 4 was energized under control based on image signals of yellow, magenta, cyan, and black in a repetition cycle of 20 m.sec/line, in phase with which the transfer recording medium 1 was conveyed by a stepping motor (not shown) and the heat roller 8. After a latent image was formed in this way, a recording paper 10 which was plain paper with a surface smoothness of 10-30 sec was superposed onto the latent image bearing surface of the transfer recording medium. The resultant laminate was conveyed through a heat roller 8 and a pinch roller 9. The heat roller 8 and the pinch roller 9 were the same as those used in Example 10 and driven in the same manner. The thus obtained full color image on the plain paper was free of color deviation, had a high degree of saturation and clearness, and was a good quality of image with good fixation characteristic.

EXAMPLE 13

Figure 14:
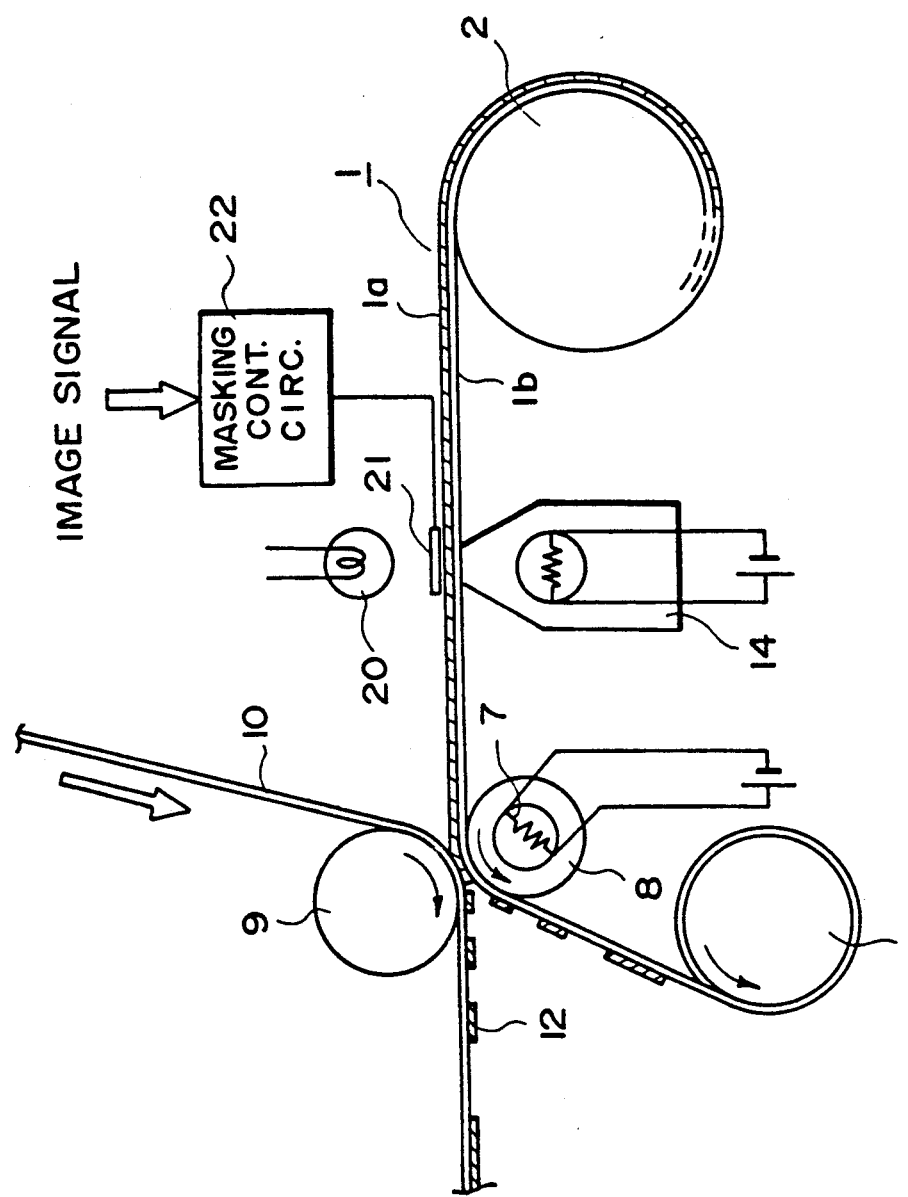
Figure 15:
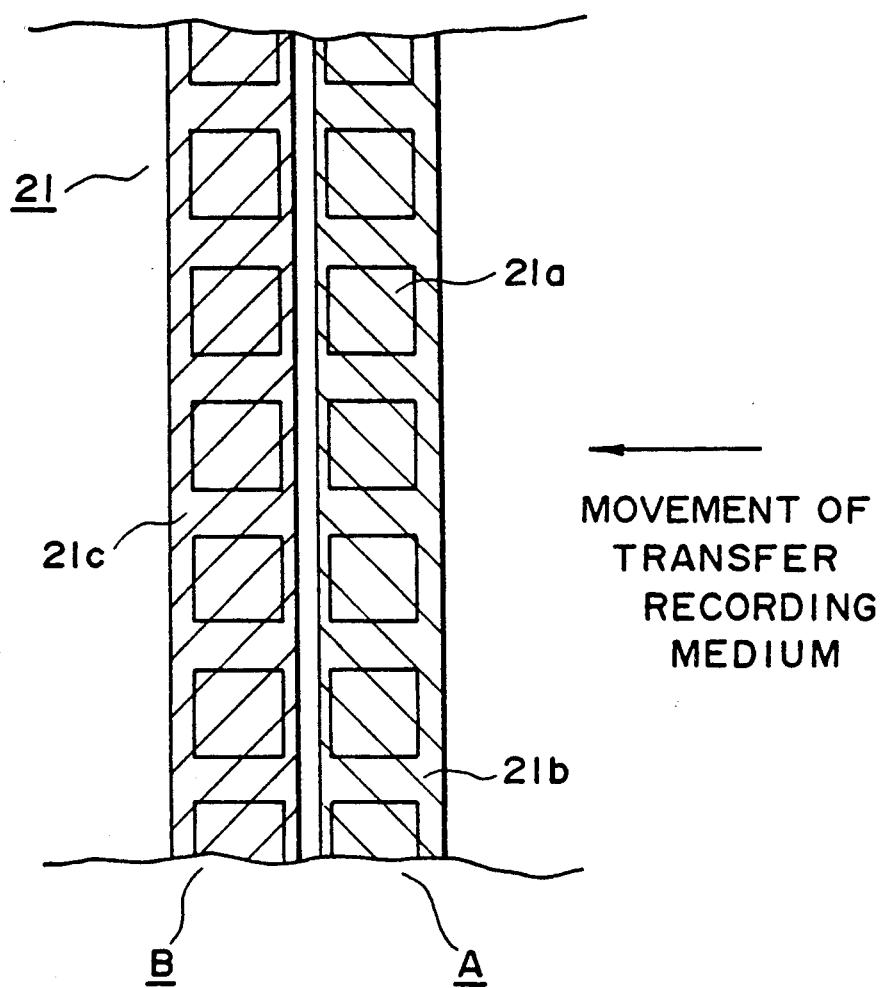
FIG. 15 is an enlarged partial plan view of a liquid crystal shutter array used in an embodiment shown in FIG. 14.

The transfer recording medium prepared in Example 10 was wound up in a roll and set in an apparatus as shown in FIG. 14.

Thus, a heat 14 capable of uniformly heating in an A4 size was disposed to heat the transfer recording medium 1 from the substrate 16 side, and opposite to the heater 14 was disposed a two-row liquid crystal shutter array 21 substantially in contact with the transfer recording medium 1. The aperture size of a unit shutter 21a was 0.4×0.4 mm, and the shutters were arranged at a pitch of 0.5 mm both longitudinally and transversely. The shutter in one row A disposed on the upstream side along the movement of the transfer recording medium 1 were applied with a yellow filter 21b (Fuji Filter SC 50) preferentially transmitting a light beam with wavelengths of 500 nm or above, and the shutters in the other row B were applied with a blue filter 21b (Fuji Filter SP1) preferentially transmitting a light beam with wavelengths of 500 nm or below. Above the shutter array 21 was disposed a white light source 20 (2 KW xenon lamp) for uniformly illuminating the shutter arry 21. A masking member (not shown) was disposed so that the light from the white light source 21 was not allowed to be incident on the transfer recording medium except through the shutter array.

Based on the above arrangement, the shutter array 21 was controlled by means of a masking or shutter control circuit 22 based on image signals applied to the circuit. In this example, a black-and-red two color negative recording was effected. Accordingly, first in the shutter array row A, shutters 21a corresponding to a "red" signal were closed, while the other shutters were opened for 28 m.sec, followed by closing for 12 m.sec. Simultaneously therewith, in the shutter array row B, shutters 21a corresponding to a "black" signal according to a preceding line or cycle of image signals were closed, while the other shutters 21a were opened for 28 m.sec, followed by closing for 12 m.sec. In this way, the shutter array 21 was driven under control based on image signals of "black" and "red" in a repetition cycle of 40 m.sec/line, in phase with which the transfer recording medium 1 was conveyed by a stepping motor (not shown) and the heat roller 8. After a latent image was formed in this way, the transfer operation was conducted in the same manner as in Example 10, whereby a two-color transfer image of good quality with a high degree of saturation and clearness was formed on plain paper without color deviation and with good fixation characteristic.

EXAMPLE 14

Image forming elements were prepared by using a core material comprising the components shown in the following Table 13 in the manner as described following the Table 13.

TABLE 13

| Item | Component | wt. % |
|---|---|---|
| Binder | poly(4,4'-isopropylidenediphenylene-1,1,3-trimethyl-3-phenylindane-5,4'-dicarboxylate: p,p'-dihydroxybiphenyl azelate) (25:75) | 50 |
| (Polymerizing component) Polymerizable monomer | tri(6-acryloyloxyhexyl)-1,3,5-benzenetricarboxylate | 20 |
| Reaction initiator | benzophenone + Michler's ketone (1:6 mixture) | 8 |
| Stabilizer | hydroquinone | 2 |
| Colorant | carbon black | 20 |

A mixture of the components shown in Table 13 in an amount of 10 g was first mixed with paraffin oil, and then with a cationic or nonionic surfactant having an HLB of at least 10, 1 g of gelatine, 1 g of gum arabic and 200 ml of water. The resultant mixture was further stirred by means of a monomizer. Then, an aqueous ammonia solution was added to adjust the pH of the mixture to 11 or above, to obtain a microcapsule slurry. The slurry was subjected to solid-liquid separation by means of a Nutsche funnel at 35° C., and the solid was dried at 35° C. for 10 hours in a vacuum drier to obtain image forming elements. The image forming elements were in the form of microcapsules with sizes in the range of 7-15 microns and an average of 10 microns, which comprises a core of the components in mixture with paraffin oil and a wall material encapsulating the core comprising gelatine and gun arabic.

The image forming elements were caused to adhere onto a PET film preliminarily coated with an about 1 micron-thick adhesive layer of a polyester resin to form a transfer recording layer.

The thus prepared transfer recording medium 1 was wound up about a feed roller 2 and set in an apparatus as shown in FIG. 3, thereby to form a transfer image under the same conditions as in Example 1 inclusive of those for latent image formation and transferring.

As a result, a clear image of a high quality and good fixation characteristic was obtained on plain paper.

EXAMPLE 15

Four kinds of image forming elements respectively in the form of microcapsules were prepared in the same manner as in Example 14 except that the compositions shown in Tables 9-12 described in Example 12 were respectively used as a core material. Equal amounts of the thus prepared four kinds of image forming elements each in the particle size range of 8-12 microns were dispersed in a binder and applied on a 6 microns-thick polyimide film to form a transfer recording layer.

The thus obtained transfer recording medium was wound up in a roll and set in an apparatus as shown in FIG. 12, and subjected to formation of a transfer image under the same conditions as in Example 12 inclusive of those for latent image formation and transferring.

As a result, a full color image of a high quality composed of four primary colors of black (BK), cyan (C), yellow (Y), and magenta (M) was obtained without color deviation, with a high degree of saturation and clearness, and with a good fixation characteristic.

EXAMPLE 16

TABLE 14

| Item | Components | wt. parts |
|---|---|---|
| (Polymerizing components) Polymerizable polymer | $\left(-CH_2-\underset{\underset{COOCH_3}{\mid}}{\overset{\overset{CH_3}{\mid}}{C}}-\right)_m$ $\left(-CH_2-\underset{\mid}{\overset{\overset{CH_3}{\mid}}{C}}-\right)_n$ $COOCH_2CH_2OCCH=CH_2$ $\phantom{COOCH_2CH_2O}\overset{\|}{O}$ $\overline{Mw} = 35000, n/m = \frac{1}{4}$ | 40 |
| Photopolymerization initiator | benzophenone/Michler's ketone | 3.0/0.5 |
| Color precursor | 3-diethylamino-6-methyl-7-phenylaminofluoran | 6 |
| Binder | polybutylmethacrylate | 12 |
| Polymerization inhibitor | hydroquinone | 0.5 |

The components shown in the above Table 14 were mixed in a solvent and applied onto a 6 micronsthick PET film under a light shielding condition, followed by drying to form a 5 microns-thick transfer recording layer. Further, a 10%-aqueous solution of polyvinyl alcohol containing about 0.1% of a fatty acid alkylol amide surfactant was applied onto the transfer recording layer to form a 3 microns-thick oxygen-shielding layer.

The thus formed transfer recording medium according to the present invention was cut into a width of 210 mm and set in an apparatus as shown in FIG. 3. The thermal head 4 was a line type one of 8 dots/mm - A4 size. The light source 3 was a 40 W-fluorescent lamp having a peak wavelength of 370 nm.

After a latent image was formed in the transfer recording layer during the latent image formation step, the transfer recording medium was once taken out of the apparatus shown in FIG. 3 and subjected to washing with water to remove the oxygen shielding layer. Then, the transfer recording medium was incorporated in the apparatus shown in FIG. 3 and conveyed to the transfer step.

The medium to be transfer-printed 10 was one having a coating layer of activated clay as a developer on the side contacting the transfer recording medium 1. The surface temperature of the heat roller 8 was set at about 80° C., and the pressure between the heat roller 8 and the pinch roller 9 was set at 25 kg/cm². After passing through the rollers, there was formed a clear black image on the medium to be transfer-printed.

What is claimed is:

1. An image forming apparatus for a method wherein a transferable portion is formed in a transfer recording layer of a transfer recording medium, transported in a predetermined direction and is then transferred to a transfer-receiving medium to form an image thereon, said apparatus comprising:

transferable portion-forming means for imparting heat and light energies so that at least one of the heat and light energies corresponds to an image signal, thereby forming the transferable portion, and transfer means for transferring the transferable portion formed in said transfer recording layer; said transfer means being disposed downstream of the transfer portion-forming means with respect to the transporting direction of the transfer recording medium.

2. An apparatus according to claim 1, wherein said means for imparting plural kinds of energies includes heating means and illumination means.

3. An apparatus according to claim 2, wherein said heating means and said illumination means are disposed opposite to each other with said transfer recording layer disposed therebetween.

4. An apparatus according to claim 3, wherein said transfer recording medium comprises a substrate and said transfer recording layer disposed on the substrate, said illumination means is disposed on the side of said transfer recording layer, and said heating means is disposed on the side of said substrate.

5. An apparatus according to claim 2, wherein said heating means is a selective heating means generating heat pulses.

6. An apparatus according to claim 2, wherein said illumination means is a means for applying light fluxes of different wavelengths based on image signals.

7. An apparatus according to claim 6, wherein said light fluxes of different wavelengths are applied in synchronism with the heat pulses from said heating means.

8. An image forming apparatus for a method wherein a transferable portion is formed in a transfer recording layer of a transfer recording medium, transported in a predetermined direction and is then transferred to a transfer-receiving medium to form an image thereon, said apparatus comprising:

a plurality of recording units, each unit comprising: heating means, illumination means for forming the transferable portion in association with the heating means and transfer means for transferring a transferable portion formed in said transfer recording layer; at least one of said heating means and said illumination means being driven based on image signals; said transfer means being disposed downstream of the heating means and the illumination means with respect to the transporting direction of the transfer recording medium.

9. An apparatus according to claim 8, wherein said heating means and said illumination means are disposed opposite to each other with said transfer recording layer disposed therebetween.

10. An apparatus according to claim 9, wherein said transfer recording medium comprises a substrate and said transfer recording layer disposed on the substrate, said illumination means is disposed on the side of said transfer recording layer, and said heating means is disposed on the side of said substrate.

11. An apparatus according to claim 8, wherein said heating means is a selective heating means generating heat pulses.

12. An apparatus according to claim 8, wherein said illumination means is a means for applying light fluxes of different wavelengths based on image signals.

13. An apparatus according to claim 12, wherein said light fluxes of different wavelengths are applied in synchronism with the heat pulses from said heating means.

14. An image forming apparatus for a method wherein a transferable portion is formed in a transfer recording layer of a transfer recording medium, transported in a predetermined direction and is then transferred to a transfer-receiving medium to form an image thereon, said apparatus comprising:

a transferable portion-forming section and transfer means for transferring the transferable portion formed in the transferable portion-forming section onto a transfer-receiving medium, said transferable portion-forming section comprising a plurality of transferable portion-forming units each comprising heating means and illumination means; said transfer means being disposed downstream of the transferable portion-forming section with respect to the transporting direction of the transfer recording medium.

15. An apparatus according to claim 14, wherein said heating means and said illumination means are disposed opposite to each other with said transfer recording layer disposed therebetween.

16. An apparatus according to claim 15, wherein said transfer recording medium comprises a substrate and said transfer recording layer disposed on the substrate, said illumination means is disposed on the side of said transfer recording layer, and said heating means is disposed on the side of said substrate.

17. An apparatus according to claim 14, wherein said heating means is a selective heating means generating heat pulses.

18. An apparatus according to claim 14, wherein said illumination means is a means for applying light fluxes of different wavelengths based on image signals.

19. An apparatus according to claim 18, wherein said light fluxes of different wavelength are applied in synchronism with the heat pulses from said heating means.

* * * * *

UNITED STATES PATENT AND TRADEMARK OFFICE
CERTIFICATE OF CORRECTION

PATENT NO. : 5,005,028

DATED : April 2, 1991

INVENTOR(S) : YASUYUKI TAMURA, ET AL.          Page 1 of 7

It is certified that error appears in the above-identified patent and that said Letters Patent is hereby corrected as shown below:

Title page:

IN [56] REFERENCES CITED

OTHER PUBLICATIONS, "(List continued on next page.)" should read --(List continued on next page.)
Patent Abstracts of Japan, vol. 8 (186):1632M-320 (1984).
Patent Abstracts of Japan, vol. 9 (235):1958M-415 (1985).
Patent Abstracts of Japan, vol. 1 (155):8244E-77 (1977).
Patent Abstracts of Japan, vol. 1 (153):8166E-77 (1977).
Patent Abstracts of Japan, vol. 1 (155):8246E-77 (1977).
Patent Abstracts of Japan, vol. 1 (159):8673E-77 (1977).
Photographic Science and Engineering,
    vol. 8 (1):18-34 (1964).
Photographic Science and Engineering,
    vol. 14 (5):347-355 (1970).
Photographic Abstracts 52 (2):63 (1972).
Patent Abstracts of Japan, vol. 6 (87):965E-108 (1982).
Patent Abstracts of Japan, vol. 3 (143):40E-154 (1979).
Patent Abstracts of Japan, vol. 7 (31):M-192 (1983).
Patent Abstracts of Japan, vol. 8 (87):M-291 (1984).
Patent Abstracts of Japan, vol. 8 (61):M-284 (1984).

IN [57] ABSTRACT

Line 7, "provided" should read --provide--.

SHEET 1 OF 15

FIG. 1D, "LAYEA" should read --LAYER--.

SHEET 6 OF 15

FIG. 6, "LIGHITING" should read --LIGHTING--.

UNITED STATES PATENT AND TRADEMARK OFFICE
CERTIFICATE OF CORRECTION

PATENT NO. : 5,005,028
DATED : April 2, 1991
INVENTOR(S) : YASUYUKI TAMURA, ET AL.

It is certified that error appears in the above-identified patent and that said Letters Patent is hereby corrected as shown below:

COLUMN 1

Line 38, "problems paper" should read --problems. Paper--.
Line 39, "exhibits" should read --exhibit--.
Line 61, "heat" should read --heat pulse-- and "be capa-" should be deleted.
Line 62, "ble of" should be deleted.

COLUMN 2

Line 1, "image" should read --image color--.
Line 5, "colors" should read --colors,--.
Line 7, "involved" should read --involved,--.
Line 8, "one" should read --one- --.
Line 16, "devised" should read --desired--.
Line 19, "of" should read --such as provision of-- and "movement repro-" should read --movements--.
Line 20, "duce of direction" should be deleted and "and" should read --reversals of direction and--.
Line 23, "This" should read --There--.
Line 34, "or" should read --on--.
Line 66, "transfer printed." should read --transfer-printed.--

COLUMN 3

Line 5, "prising" should read --prising:--.

UNITED STATES PATENT AND TRADEMARK OFFICE
CERTIFICATE OF CORRECTION

PATENT NO. : 5,005,028

DATED : April 2, 1991

INVENTOR(S) : YASUYUKI TAMURA, ET AL.

It is certified that error appears in the above-identified patent and that said Letters Patent is hereby corrected as shown below:

COLUMN 4

Line 18, "transfer printed," should read --transfer-printed,--.
    Line 20, "temperature" should read --temperature.--.
    Line 36, "thereafter" should read --thereafter.--.
    Line 43, "then" should read --which is then-- and "decrease" should read --decrease.--.
    Line 59, "transfer printed" should read --transfer-printed--.

COLUMN 5

Line 44, "rolls" should read --rollers--.

COLUMN 6

Line 14, "or" should read --on--.
    Line 38, "a" should read --the--.

COLUMN 7

Line 17, "wavelength (Y)" should read --wavelength $\lambda(Y)$--.
    Line 22, "a" (first occurrence) should be deleted.
    Line 47, "heat" should read --heat.--.
    Line 50, "(In" should read --(in--.

COLUMN 8

Line 27, "are" should read --is--.

UNITED STATES PATENT AND TRADEMARK OFFICE
CERTIFICATE OF CORRECTION

PATENT NO. : 5,005,028
DATED : April 2, 1991
INVENTOR(S) : YASUYUKI TAMURA, ET AL.

It is certified that error appears in the above-identified patent and that said Letters Patent is hereby corrected as shown below:

COLUMN 9

Line 23, "core" should read --core.--.
    Line 35, "a" should read --an--.
    Line 43, "energies" should read --energies.--.
    Line 47, "constituting" should read --constitute--.
    Line 48, "contains" should read --which contains--.
    Line 49, "colorant" should read --colorant.--.

COLUMN 10

Line 11, "N,N'-methylencbisacrylamide" should read
          --N,N'-methylenebisacrylamide--.
    Line 16, "1,4-bitanediol" should read
          --1,4-butanediol--.
    Line 25, "include;" should read --include:--.
    Line 31, "tetrachloride" should read --tetrachloride,--.

COLUMN 13

Line 9, "oxygenshielding" should read
         --oxygen-shielding--.

COLUMN 14

Line 28, "application" should read --application.--.
    Line 30, "is" should read --are--.
    Line 31, "mixed" should read --mixed with--.
    Line 66, "20-200 µJ" should read --20-200 µJ/--.

UNITED STATES PATENT AND TRADEMARK OFFICE
CERTIFICATE OF CORRECTION

PATENT NO. : 5,005,028
DATED : April 2, 1991
INVENTOR(S) : YASUYUKI TAMURA, ET AL.

It is certified that error appears in the above-identified patent and that said Letters Patent is hereby corrected as shown below:

COLUMN 15

Line 14, "printed" should read --printed.--.
    Line 64, "roller 10" should read --roller 11--.

COLUMN 16

Line 48, "contol-lability" should read
        --controllability--.

COLUMN 19

Line 66, "freely and independently" should read
        --free and independent--.

COLUMN 20

Line 55, "transferprinted" should read
        --transfer-printed--.

COLUMN 21

Line 44, "is" should read --are--.
    Line 46, "becomes" should read --become--.
    Line 51, "Futher," should read --Further,--.
    Line 55, "Futher," should read Further,--.

COLUMN 22

Line 15, "microns thick" should read --microns-thick--.

COLUMN 23

Line 3, "oxygenshielding" should read
        --oxygen-shielding--.

UNITED STATES PATENT AND TRADEMARK OFFICE
CERTIFICATE OF CORRECTION

PATENT NO. : 5,005,028
DATED : April 2, 1991
INVENTOR(S) : YASUYUKI TAMURA, ET AL.

It is certified that error appears in the above-identified patent and that said Letters Patent is hereby corrected as shown below:

COLUMN 24

Line 60, "microns thick" should read --microns-thick--.

COLUMN 27

Line 1, "produced" should read --produce--.

COLUMN 28

Line 39, "elements" should read --element--.

COLUMN 30

Line 3, "W-heater" should read --W heater--.

COLUMN 31

Line 17, "ash" should read --as--.
    Line 49, "n," should read --nm,--.

COLUMN 33

Line 42, "element" should read --elements--.
    Line 45, "sopier 3a" should read --copier 3a--.

COLUMN 34

Line 29, "heat 14" should read --heater 14--.
    Line 37, "shutter" should read --shutters--.
    Line 42, "filter 21b" should read --filter 21c--.

UNITED STATES PATENT AND TRADEMARK OFFICE
CERTIFICATE OF CORRECTION

PATENT NO. : 5,005,028
DATED : April 2, 1991
INVENTOR(S) : YASUYUKI TAMURA, ET AL.

It is certified that error appears in the above-identified patent and that said Letters Patent is hereby corrected as shown below:

COLUMN 34

Line 46, "arry" should read --array--.
Line 48, "source 21" should read --source 20--.

COLUMN 35

Line 41, "comprises" should read --comprise--.

COLUMN 36

Line 37, "micronsthick" should read --microns-thick--.

COLUMN 38

Line 54, "wavelength" should read --wavelengths--.

COLUMN 5

Line 43, "be ween" should read --between--.

Signed and Sealed this

Fifteenth Day of December, 1992

Attest:

DOUGLAS B. COMER

*Attesting Officer*     *Acting Commissioner of Patents and Trademarks*